US010632751B2

(12) United States Patent
Kura

(10) Patent No.: US 10,632,751 B2
(45) Date of Patent: Apr. 28, 2020

(54) LIQUID DISCHARGE HEAD

(71) Applicant: Brother Kogyo Kabushiki Kaisha, Nagoya-shi, Aichi-ken (JP)

(72) Inventor: Keiji Kura, Chita (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 16/357,423

(22) Filed: Mar. 19, 2019

(65) Prior Publication Data

US 2019/0299617 A1    Oct. 3, 2019

(30) Foreign Application Priority Data

Mar. 30, 2018   (JP) ................. 2018-067761

(51) Int. Cl.
*B41J 2/14* (2006.01)
*H01L 41/047* (2006.01)

(52) U.S. Cl.
CPC ........ *B41J 2/14274* (2013.01); *H01L 41/047* (2013.01); *B41J 2002/14459* (2013.01); *B41J 2002/14491* (2013.01)

(58) Field of Classification Search
CPC ............... B41J 2/14274; B41J 2/14201; B41J 2/14209; B41J 2/14233; B41J 2002/14491; B41J 2002/14459; H01L 41/047
See application file for complete search history.

(56) References Cited

U.S. PATENT DOCUMENTS

| 6,412,926 B1 * | 7/2002 | Okuda ............... B41J 2/045 |
| 2009/0002460 A1 * | 1/2009 | Hayashi ............ B41J 2/14274 |
| 2009/0096844 A1 | 4/2009 | Kojima et al. |

FOREIGN PATENT DOCUMENTS

| JP | 2003-128460 A | 5/2003 |
| JP | 2009-096173 A | 5/2009 |

* cited by examiner

*Primary Examiner* — Juanita D Jackson
(74) *Attorney, Agent, or Firm* — Banner & Witcoff, Ltd.

(57) ABSTRACT

A liquid discharge head includes: a channel unit having a discharge surface that is parallel to a first direction and a second direction orthogonal to the first direction, and a pressure chamber; and a piezoelectric actuator stacked on the channel unit in a third direction perpendicular to the discharge surface. The piezoelectric actuator includes: a piezoelectric body having piezoelectric layers stacked in the third direction; a first electrode; and second and third electrodes separated from the first electrode in the third direction. The piezoelectric body has a first portion that is interposed in the third direction between the first and second electrodes and that at least partially overlaps in the third direction with the pressure chamber; a second portion that is interposed in the third direction between the first and third electrodes; and a third portion that is interposed in the third direction between the first and third electrodes.

18 Claims, 18 Drawing Sheets

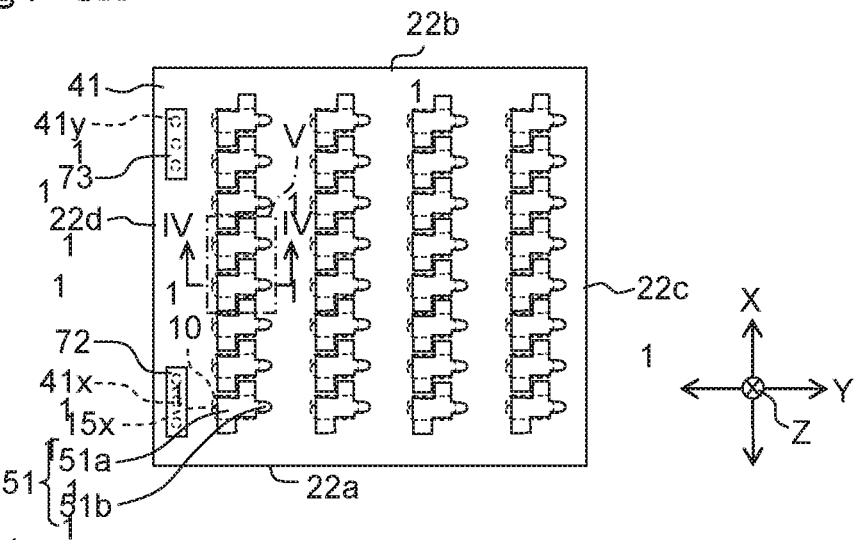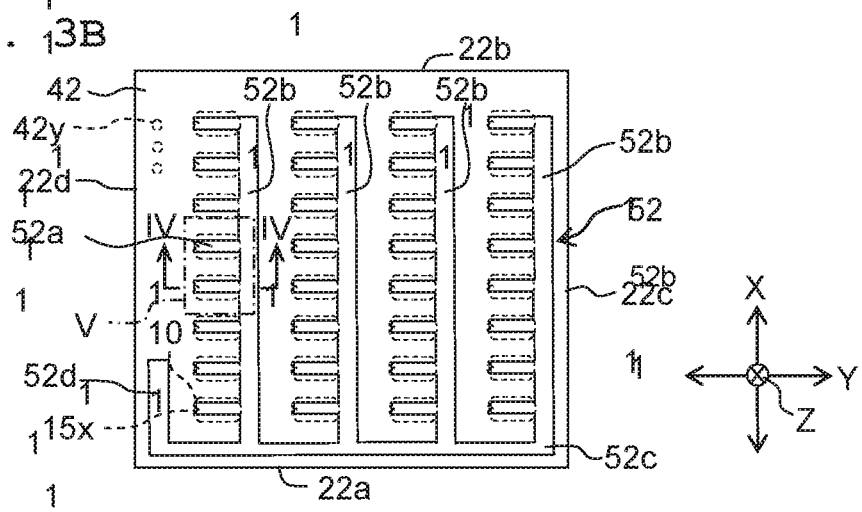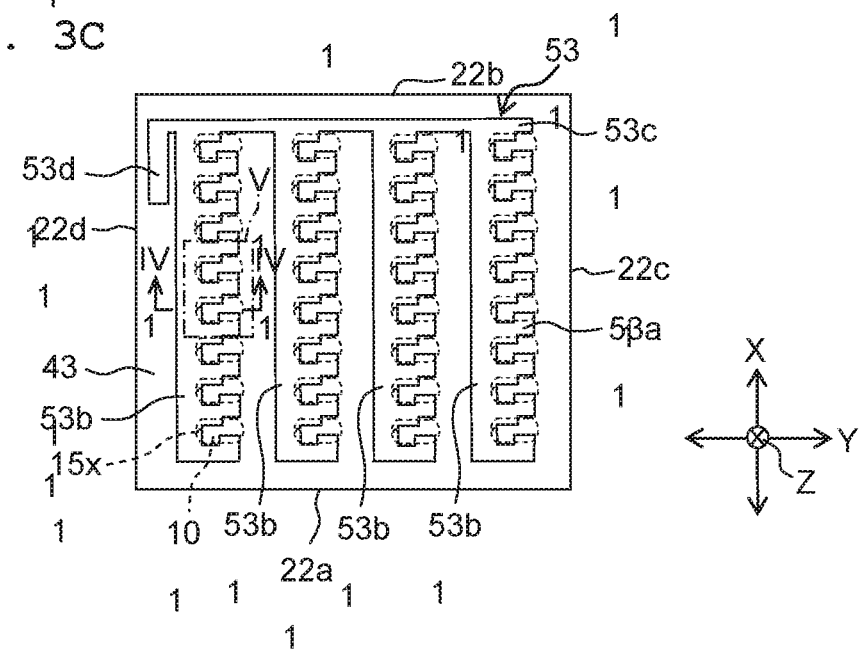

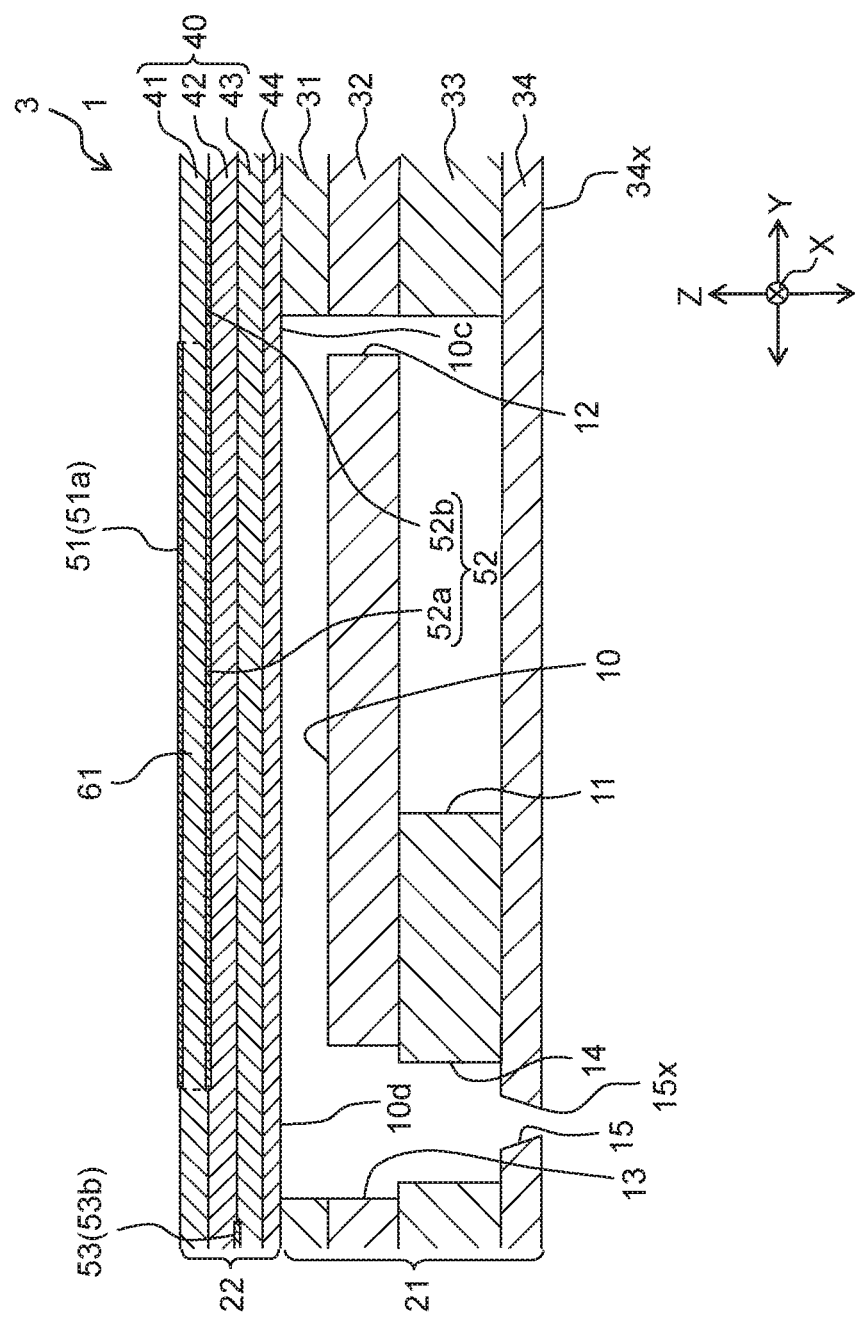

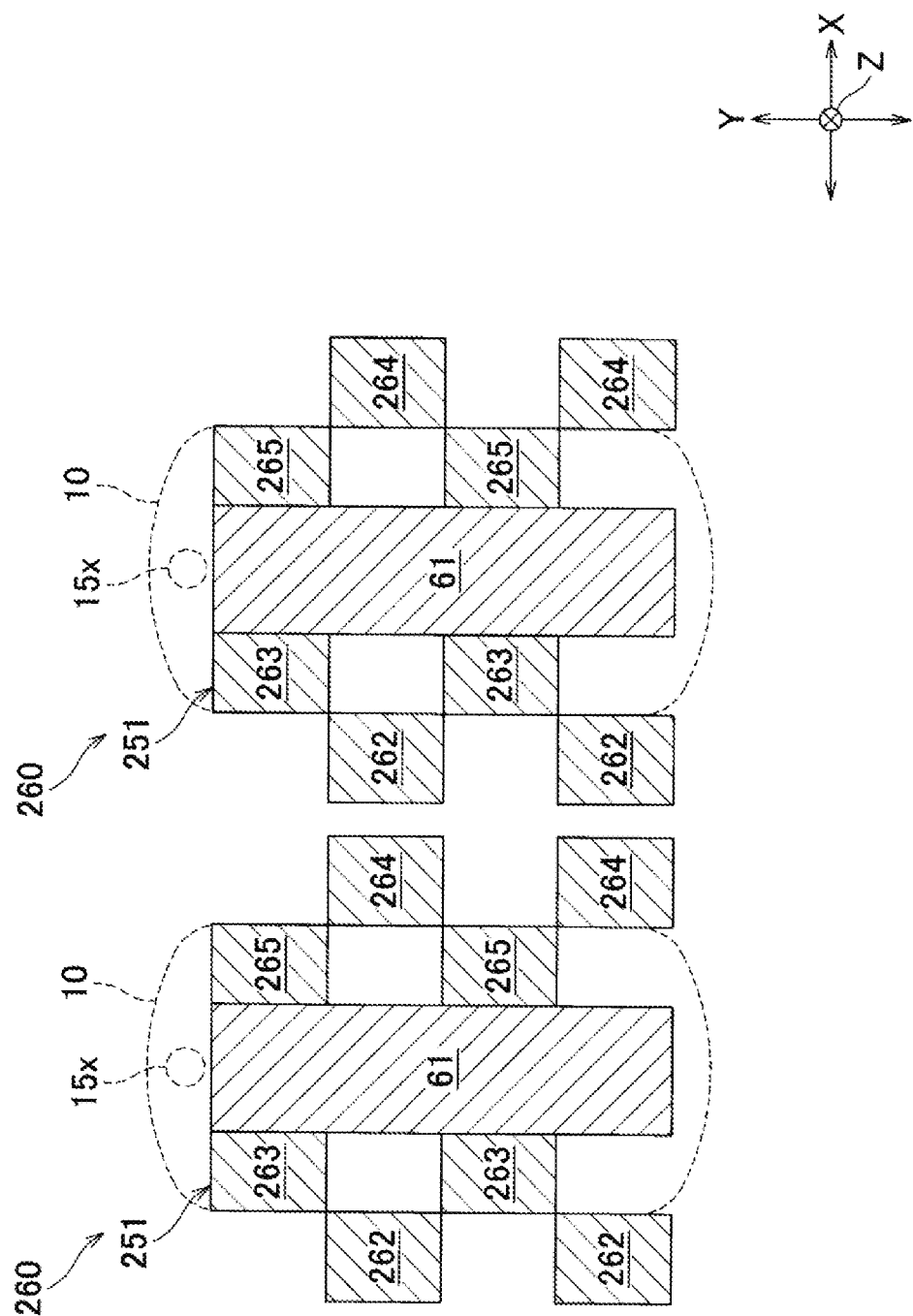

LIQUID DISCHARGE HEAD

CROSS REFERENCE TO RELATED APPLICATION

The present application claims priority from Japanese Patent Application No. 2018-067761 filed on Mar. 30, 2018, the disclosure of which is incorporated herein by reference in its entirety.

BACKGROUND

Field of the Invention

The present teaching relates to a liquid discharge head including a channel unit and a piezoelectric actuator stacked on the channel unit.

Description of the Related Art

There is known a liquid discharge head including: a channel unit that has a discharge surface parallel to an X direction (first direction) and a Y direction (second direction); and a piezoelectric actuator stacked on the channel unit in a Z direction (third direction). The piezoelectric actuator includes a first active portion that overlaps in the Z direction with a pressure chamber of the channel unit and two second active portions separated from each other in the X direction. In a cross-section along the X direction and Z direction passing through the pressure chamber, the first active portion, and the two second active portions in the liquid discharge head, the two second active portions are separated in the X direction from the first active portion by the same distance.

SUMMARY

An actuator unit formed from the first active portion and the two second active portions may suffer from a decrease in its deformation amount (hereinafter referred to as a drive deterioration) due to an increase in its deformation count. In the configuration of the liquid discharge head described above, the two second active portions are separated in the X direction from the first active portion by the same distance, in the cross-section along the X direction and Z direction passing through the pressure chamber, the first active portion, and the two second active portions. In that configuration, the drive deterioration of the actuator unit is conspicuous as shown in an experimental result described below.

An object of the present teaching is to provide a liquid discharge head that is capable of inhibiting a drive deterioration of an actuator unit.

According to a first aspect of the present teaching, there is provided a liquid discharge head including: a channel unit having a discharge surface that defines a discharge opening and that is parallel to a first direction and a second direction orthogonal to the first direction, and a pressure chamber communicating with the discharge opening; and a piezoelectric actuator stacked on the channel unit in a third direction perpendicular to the discharge surface, wherein the piezoelectric actuator includes: a piezoelectric body having piezoelectric layers stacked in the third direction; a first electrode; a second electrode separated from the first electrode in the third direction; and a third electrode separated from the first electrode in the third direction, the piezoelectric body has: a first portion that is interposed in the third direction between the first electrode and the second electrode and that at least partially overlaps in the third direction with the pressure chamber; a second portion that is interposed in the third direction between the first electrode and the third electrode; and a third portion that is interposed in the third direction between the first electrode and the third electrode and that is separated from the second portion in the first direction, the first portion has a portion that is positioned in the first direction between the second portion and the third portion, the piezoelectric actuator has a first end and a second end in the first direction, the first portion has a first end and a second end in the first direction, the second end of the first portion is positioned in the first direction between the first end of the first portion and the second end of the piezoelectric actuator, the second portion has a first end and a second end in the first direction, the second end of the second portion is positioned in the first direction between the first end of the second portion and the second end of the piezoelectric actuator, the third portion has a first end and a second end in the first direction, the second end of the third portion is positioned in the first direction between the first end of the third portion and the second end of the piezoelectric actuator, the second end of the second portion is positioned in the first direction between the first end of the second portion and the first end of the first portion, and the first end of the third portion is positioned at any of the following positions (a) to (c):

(a) a position in the first direction between the first end and the second end of the first portion (b) a position that is the same, in the first direction, as the second end of the first portion, and (c) a position in the first direction between the second end of the first portion and the second end of the third portion, wherein a distance in the first direction from the second end of the first portion to the first end of the third portion is shorter than a distance in the first direction from the second end of the second portion to the first end of the first portion.

According to a second aspect of the present teaching, there is provided a liquid discharge head including: a channel unit having a discharge surface that defines a discharge opening and that is parallel to a first direction and a second direction orthogonal to the first direction, and a pressure chamber communicating with the discharge opening; and a piezoelectric actuator stacked on the channel unit in a third direction perpendicular to the discharge surface, wherein the piezoelectric actuator includes: a piezoelectric body having piezoelectric layers stacked in the third direction; a first electrode; a second electrode separated from the first electrode in the third direction; and a third electrode separated from the first electrode in the third direction, the piezoelectric body has: a first portion that is interposed in the third direction between the first electrode and the second electrode and that at least partially overlaps in the third direction with the pressure chamber; a second portion that is interposed in the third direction between the first electrode and the third electrode; and a third portion that is interposed in the third direction between the first electrode and the third electrode, wherein a position in the second direction of the third portion is different from that of the second portion, the third portion has a portion that is positioned in the first direction between the second portion and the first portion, the piezoelectric actuator has a first end and a second end in the first direction, the first portion has a first end and a second end in the first direction, the second end of the first portion is positioned in the first direction between the first end of the first portion and the second end of the piezoelectric actuator, the second portion has a first end and a second end in the first direction, the second end of the second portion is positioned in the first direction between the first end of the second portion and the second end of the piezoelectric actuator, the third portion has a first end and a second end in the first direction, the second end of the third portion is positioned in the first direction between the first end of the third portion and the second end of the piezoelectric actuator, the second end of the second portion is positioned in the first direction between the first end of the second portion and the first end of the first portion, and the second end of the third portion is positioned at any of the following positions (a) to (c):

(a) a position in the first direction between the first end and the second end of the first portion (b) a position that is the same, in the first direction, as the first end of the first portion, and (c) a position in the first direction between the first end of the third portion and the first end of the first portion, wherein a distance in the first direction from the second end of the third portion to the first end of the first portion is shorter than a distance in the first direction from the second end of the second portion to the first end of the first portion.

The first aspect of the present teaching satisfies the condition "the second end of the second portion is positioned in the first direction between the first end of the second portion and the first end of the first portion, and the first end of the third portion is positioned at any of the following positions (a) to (c): (a) a position in the first direction between the first end and the second end of the first portion; (b) a position that is the same, in the first direction, as the second end of the first portion, and (c) a position in the first direction between the second end of the first portion and the second end of the third portion, wherein a distance in the first direction from the second end of the first portion to the first end of the third portion is shorter than a distance in the first direction from the second end of the second portion to the first end of the first portion." The second aspect of the present teaching satisfies the following condition "the second end of the second portion is positioned in the first direction between the first end of the second portion and the first end of the first portion, and the second end of the third portion is positioned at any of the following positions (a) to (c): (a) a position in the first direction between the first end and the second end of the first portion; (b) a position that is the same, in the first direction, as the first end of the first portion; and (c) a position in the first direction between the first end of the third portion and the first end of the first portion, wherein a distance in the first direction from the second end of the third portion to the first end of the first portion is shorter than a distance in the first direction from the second end of the second portion to the first end of the first portion." In the configuration satisfying any of the above conditions, the second portion may have a drive deterioration as the deformation count of the actuator unit increases as shown in the experimental result described below. However, the deformation amount of the actuator unit due to contraction of the third portion increases and thus the drive deterioration of the entire actuator unit is inhibited. Namely, satisfying any of the above conditions can inhibit the drive deterioration of the actuator unit.

The present teaching can inhibit the drive deterioration of the actuator unit.

BRIEF DESCRIPTION OF THE DRAWINGS

FIGS. 3A to 3C are plan views of upper surfaces of three piezoelectric layers of the piezoelectric actuator in FIG. 2, wherein FIG. 3A depicts the upper surface of the uppermost piezoelectric layer, FIG. 3B depicts the upper surface of the intermediate piezoelectric layer, and FIG. 3C depicts the upper surface of the lowermost piezoelectric layer.

FIG. 4 is a cross-sectional view taken along a line IV-IV in FIG. 2 and FIGS. 3A to 3C.

FIG. 16A depicts a head according to a first modified example of the present teaching, FIG. 16B depicts a head according to a second modified example of the present teaching, and FIG. 16C depicts a head according to a third modified example of the present teaching.

FIG. 18 is a head according to a sixth modified example of the present teaching and corresponds to FIG. 8.

DESCRIPTION OF THE EMBODIMENTS

First Embodiment

Figure 1:
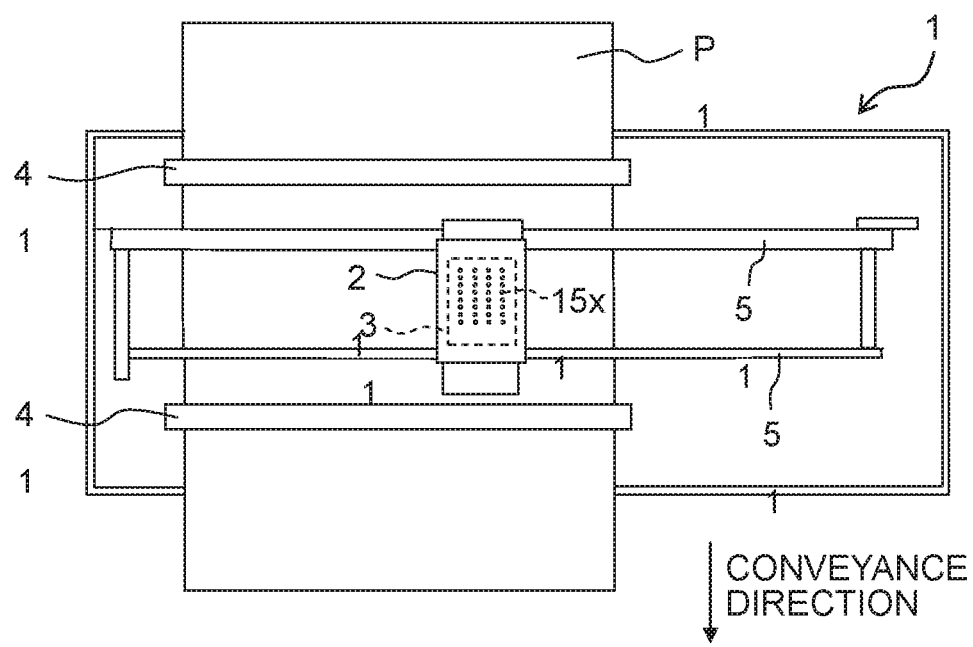
FIG. 1 schematically depicts a configuration of a printer including a head according to a first embodiment of the present teaching.

Referring to FIG. 1, a configuration of a printer 1 including a head 3 (an exemplary liquid discharge head) according to a first embodiment of the present teaching is explained.

In the following, a Z direction is a vertical direction, and an X direction and a Y direction are directions along a horizontal surface. The X direction, Y direction, and Z direction are orthogonal to each other. The X direction corresponds to a first direction, the Y direction corresponds to a second direction, and the Z direction corresponds to a third direction.

The printer 1 includes the head 3, a carriage 2, and two conveyance roller pairs 4.

The carriage 2, which is supported by two guide rails 5 extending in the Y direction, is movable in the Y direction along the guide rails 5.

The head 3 is a serial-type head, is carried on the carriage 2, and is movable in the Y direction together with the carriage 2. The head 3 has a lower surface (a surface facing downward in the Z direction) in which 32 pieces of discharge opening 15x are open. The lower surface of the head 3 is a discharge surface 34x (see FIG. 4) in which 32 pieces of the discharge opening 15x are defined. The discharge surface 34x is parallel to the X direction and the Y direction and the Z direction is perpendicular to the discharge surface 34x.

The two conveyance roller pairs 4 are arranged with the carriage 2 interposed therebetween in the X direction. Rotating the conveyance roller pairs 4 with a sheet P being nipped thereby conveys the sheet P in a conveyance direction, which is along the X direction.

A controller (not depicted) of the printer 1 alternately executes a discharge operation and a conveyance operation by controlling the carriage 2, the head 3, and the conveyance roller pairs 4. In the discharge operation, ink is discharged from the discharge openings 15x while moving the head 3 in the Y direction together with the carriage 2. In the conveyance operation, the conveyance roller pairs 4 convey the sheet P in the conveyance direction by a predefined amount. Accordingly, an image is recorded on the sheet P.

Referring to FIGS. 2 to 5, a configuration of the head 3 is explained.

Figure 2:
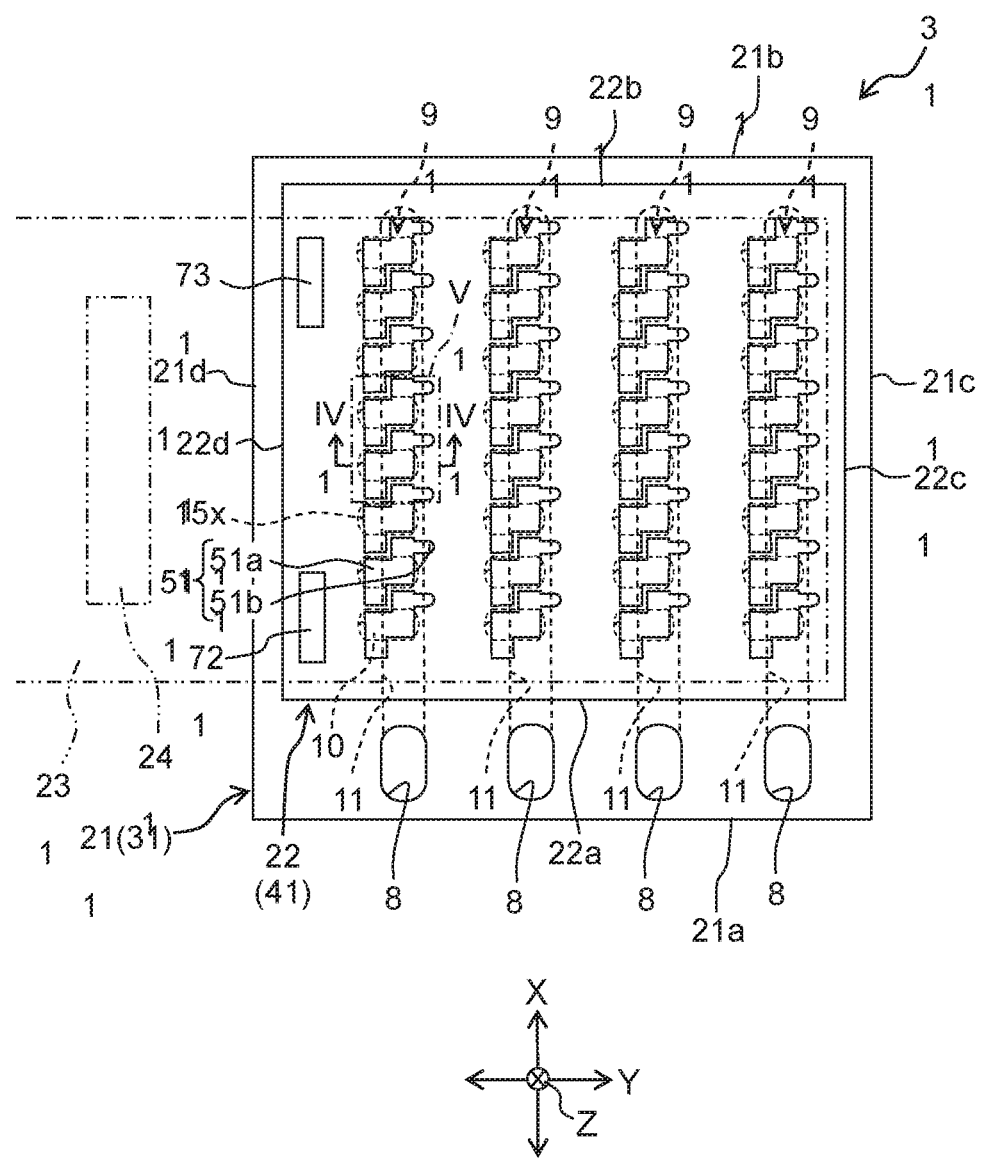
FIG. 2 is a plan view of the head in FIG. 1.

As depicted in FIG. 2, the head 3 includes a channel unit 21, a piezoelectric actuator 22, and a Chip on Film (COF) 23.

In the channel unit 21, a first end 21a and a second end 21b in the X direction are parallel to the Y direction, and a first end 21c and a second end 21d in the Y direction are parallel to the X direction. In the piezoelectric actuator 22, a first end 22a and a second end 22b in the X direction are parallel to the Y direction, and a first end 22c and a second end 22d in the Y direction are parallel to the Y direction. Namely, each of the channel unit 21 and the piezoelectric actuator 22 has a substantially rectangular shape when viewed from the Z direction. The channel unit 21 is one size bigger than (slightly bigger than) the piezoelectric actuator 22 when viewed from the Z direction.

As depicted in FIG. 4, the channel unit 21 includes four plates 31 to 34 stacked on top with each other in the Z direction.

The plate 31 includes 32 pieces of pressure chamber 10. As depicted in FIG. 2, each of the pressure chambers 10 has a substantially rectangular shape when viewed from the Z direction and the length in the Y direction is longer than the length in the X direction. 32 pieces of the pressure chamber 10 form four pressure chamber rows 9. Each of the four pressure chamber rows 9, which extends in the X direction, is formed from eight pressure chambers 10. The eight pressure chambers 10 in each of the four pressure chamber rows 9 are arranged in the X direction at regular intervals. The four pressure chamber rows 9 are arranged in the Y direction.

As depicted in FIG. 4, each pressure chamber 10 in the plate 32 has through holes 12 and 13. The through holes 12 and 13 respectively overlap, in the Z direction, with a first end 10c and a second end 10d in the Y direction of the corresponding pressure chamber 10. Ink flows through the through hole 12 in the Z direction and flows through the pressure chamber 10 in the Y direction. The cross-sectional area of the through hole 12 orthogonal to the Z direction is smaller than the cross-sectional area of the pressure chamber 10 orthogonal to the Y direction. The through hole 12 thus functions as a throttling channel.

The plate 33 has through holes 14 corresponding to the through holes 13 in the plate 32. Each of the through holes 14 overlaps in the Z direction with the corresponding through hole 13.

The plate 33 includes four manifold channels 11. As depicted in FIG. 2, the four manifold channels 11 correspond to the four pressure chamber rows 9, respectively. Each of the manifolds 11 extends in the X direction and has a portion that overlaps in the Z direction with the eight pressure chambers 10 of the corresponding pressure chamber row 9.

Four ink supply ports 8 are provided in a portion of an upper surface of the plate 31 where the piezoelectric actuator 22 is not arranged. The four ink supply ports 8 are positioned to overlap in the Z direction with ends in the X direction (lower ends in FIG. 2) of the four manifold channels 11, respectively. Inks are supplied from the four ink supply ports 8 to the four manifold channels 11, respectively.

The plate 34 includes 32 pieces of nozzle 15. Each of the nozzles 15 overlaps in the Z direction with the corresponding one of the through holes 14. Openings of the nozzles 15 that are open in a lower surface (discharge surface 34x) of the plate 34 correspond to the discharge openings 15x.

Each of the four manifold channels 11 communicates with the eight pressure chambers 10 of the corresponding one of the pressure chamber rows 9 via the through holes 12. Each of the pressure chambers 10 communicates with the discharge opening 15x of the nozzle 15 via the through holes 13 and 14.

As depicted in FIG. 4, the piezoelectric actuator 22 is stacked on the channel unit 21 in the Z direction. The piezoelectric actuator 22 is arranged on the upper surface of the plate 31.

The piezoelectric actuator 22 includes a piezoelectric body 40, an ink separation layer 44, 32 pieces of driving electrode 51, a high potential electrode 52, and a low potential electrode 53.

The piezoelectric body 40 has three piezoelectric layers 41 to 43 stacked on top of each other in the Z direction. The piezoelectric layers 41 to 43 and the ink separation layer 44 have the same shape and the same size when viewed from the Z direction. As depicted in FIG. 2, the piezoelectric layers 41 to 43 and the ink separation layer 44 define an external form of the substantially rectangular piezoelectric actuator 22 when viewed from the Z direction.

As depicted in FIG. 4, the ink separation layer 44 is arranged on the upper surface of the plate 31 to cover all the pressure chambers 10 formed in the plate 32. The ink separation layer 44 is made from, for example, a metallic material such as stainless steel, a piezoelectric material composed primarily of lead zirconate titanate, or a synthetic resin material.

The piezoelectric layer 43 is arranged on an upper surface of the ink separation layer 44. The piezoelectric layer 42 is arranged on an upper surface of the piezoelectric layer 43. The piezoelectric layer 41 is arranged on an upper surface of the piezoelectric layer 42. The piezoelectric layers 41 to 43 overlap in the Z direction with the ink separation layer 44.

The piezoelectric layers 41 to 43 are made from a piezoelectric material composed primarily of lead zirconate titanate.

32 pieces of the driving electrode 51, the high potential electrode 52, and the low potential electrode 53 have mutually different positions in the Z direction. Specifically, 32 pieces of the driving electrode 51, the high potential electrode 52, and the low potential electrode 53 are arranged in that order in the Z direction from the top of the piezoelectric body 40. 32 pieces of the driving electrode 51 are farther from the pressure chambers 10 in the Z direction than the high potential electrode 52 and the low potential electrode 53. The high potential electrode 52 is farther from the pressure chambers 10 in the Z direction than the low potential electrode 53. The high potential electrode 52 and the low potential electrode 53 are separated from 32 pieces of the driving electrode 51 in the Z direction.

In this embodiment, no positional shift is caused between the channel unit 21 and the piezoelectric actuator 22. Namely, the following explanation is made on the assumption that no positional shift is caused between the pressure chambers 10 of the channel unit 21 and the electrodes, active portions of the piezoelectric actuator 22.

As depicted in FIG. 2, 32 pieces of the driving electrode 51 are provided on the upper surface of the piezoelectric layer 41 while corresponding to the pressure chambers 10 formed in the plate 31. Each of the driving electrodes 51 has a main portion 51a and a protrusion 51b. When viewed from the Z direction, the main portion 51a has two substantially rectangular portions that are arranged in the Y direction such that one of the two is shifted in the X direction from the other. The main portion 51a has a portion that overlaps in the Z direction with the corresponding pressure chamber 10 and portions that do not overlap in the Z direction with the corresponding pressure chamber 10. The protrusion 51b protrudes from the main portion 51a in the Y direction. The whole of the protrusion 51b does not overlap in the Z direction with the corresponding pressure chamber 10. The protrusions 51b of 32 pieces of the driving electrode 51 have the same protruding direction. The protrusions 51b have contacts that electrically connect to traces of the COF 23.

A driver IC 24 mounted on the COF 23 individually applies, via the traces of the COF 23, any of a high potential (VDD potential) and a low potential (GND potential) to 32 pieces of the driving electrode 51.

As depicted in FIG. 4, the high potential electrode 52 is formed on the upper surface of the piezoelectric layer 42 and positioned between the piezoelectric layers 41 and 42 in the Z direction.

As depicted in FIG. 3B, the high potential electrode 52 has 32 pieces of individual portion 52a, four connecting portions 52b, a connecting portion 52c, and a drawing-out portion 52d. Each of the individual portion 52a overlaps in the Z direction with a center portion in the X direction of the corresponding one of the pressure chambers 10 formed in the plate 31. The four connecting portions 52b correspond to the four pressure chamber rows 9, respectively. Each of the connecting portions 52b extends in the X direction to connect ends in the Y direction (right ends in FIG. 3B) of the individual portions 52a, which correspond to the eight pressure chambers 10 of the corresponding pressure chamber row 9. The connecting portion 52c extends in the Y direction to connect ends in the X direction (lower ends in FIG. 3B) of the four connecting portions 52b. The drawing-out portion 52d is drawn out from an end in the Y direction (left end in FIG. 3B) of the connecting portion 52c such that the drawing-out portion 52d extends in the X direction from the first end 22a toward the second end 22b of the piezoelectric actuator 22. The extending direction of the drawing-out portion 52d from the connecting portion 52c is the same as the extending direction of the four connecting portions 52b from the connecting portion 52c. The drawing-out portion 52d is connected to a surface electrode 72 via a through hole 41x (see FIG. 3A) formed in the piezoelectric layer 41. The surface electrode 72 is disposed on the upper surface of the piezoelectric layer 41 to overlap in the Z direction with the drawing-out portion 52d. The surface electrode 72 is electrically connected to the traces of the COF 23.

The driver IC 24 applies the high potential (VDD potential) to the high potential electrode 52 via the traces of the COF 23.

As depicted in FIG. 4, the low potential electrode 53 is formed on the upper surface of the piezoelectric layer 43 and arranged between the piezoelectric layers 42 and 43 in the Z direction.

As depicted in FIG. 3C, the low potential electrode 53 includes 32 pieces of individual portion 53a, four connecting portions 53b, a connecting portion 53c, and a drawing-out portion 53d. Each individual portion 53a is disposed between two pressure chambers 10 that are adjacent to each other in the X direction. Further, each individual portion 53a is disposed between the first end 22a in the X direction of the piezoelectric actuator 22 and the pressure chamber 10 adjacent to the first end 22a in the X direction. Each individual portion 53a that is included in 32 pieces of the individual portion 53a and different from four individual portions 53a positioned at an end in the X direction (lower end in FIG. 3C) partially overlaps in the Z direction with two pressure chambers 10 adjacent to each other in the X direction. The four individual portions 53a partially overlap in the Z direction with four pressure chambers 10, which are adjacent to the first end 22a of the piezoelectric actuator 22 in the X direction. The four connecting portions 53b correspond to the four pressure chamber rows 9, respectively. Each connecting portion 53b extends in the X direction and connects ends in the Y direction (left ends in FIG. 3C) of the individual portions 53a, which respectively correspond to the eight pressure chambers 10 of the pressure chamber row 9. The connecting portion 53c extends in the Y direction and connects ends in the X direction (upper ends in FIG. 3C) of the four connecting portions 53b. The connecting portion 53c partially overlaps in the Z direction with four pressure chambers 10 that are adjacent to the second end 22b of the piezoelectric actuator 22 in the X direction. The drawing-out portion 53d is drawn out from an end in the Y direction (left end in FIG. 3C) of the connecting portion 53c such that the drawing-out portion 53d extends in the X direction from the second end 22b toward the first end 22a of the piezoelectric actuator 22. The extending direction of the drawing-out portion 53d from the connecting portion 53c is the same as the extending direction of the four connecting portions 53b from the connecting portion 53c. The drawing-out portion 53d is connected to a surface electrode 73 via a through hole 41y (see FIG. 3A) formed in the piezoelectric layer 41 and a through hole 42y (see FIG. 3B) formed in the piezoelectric layer 42. The surface electrode 73 is disposed on the upper surface of the piezoelectric layer 41 to overlap in the Z direction with the drawing-out portion 53d. The surface electrode 73 is electrically connected to the traces of the COF 23.

The driver IC 24 applies the low potential (GND potential) to the low potential electrode 53 via the traces of the COF 23.

Figure 5:
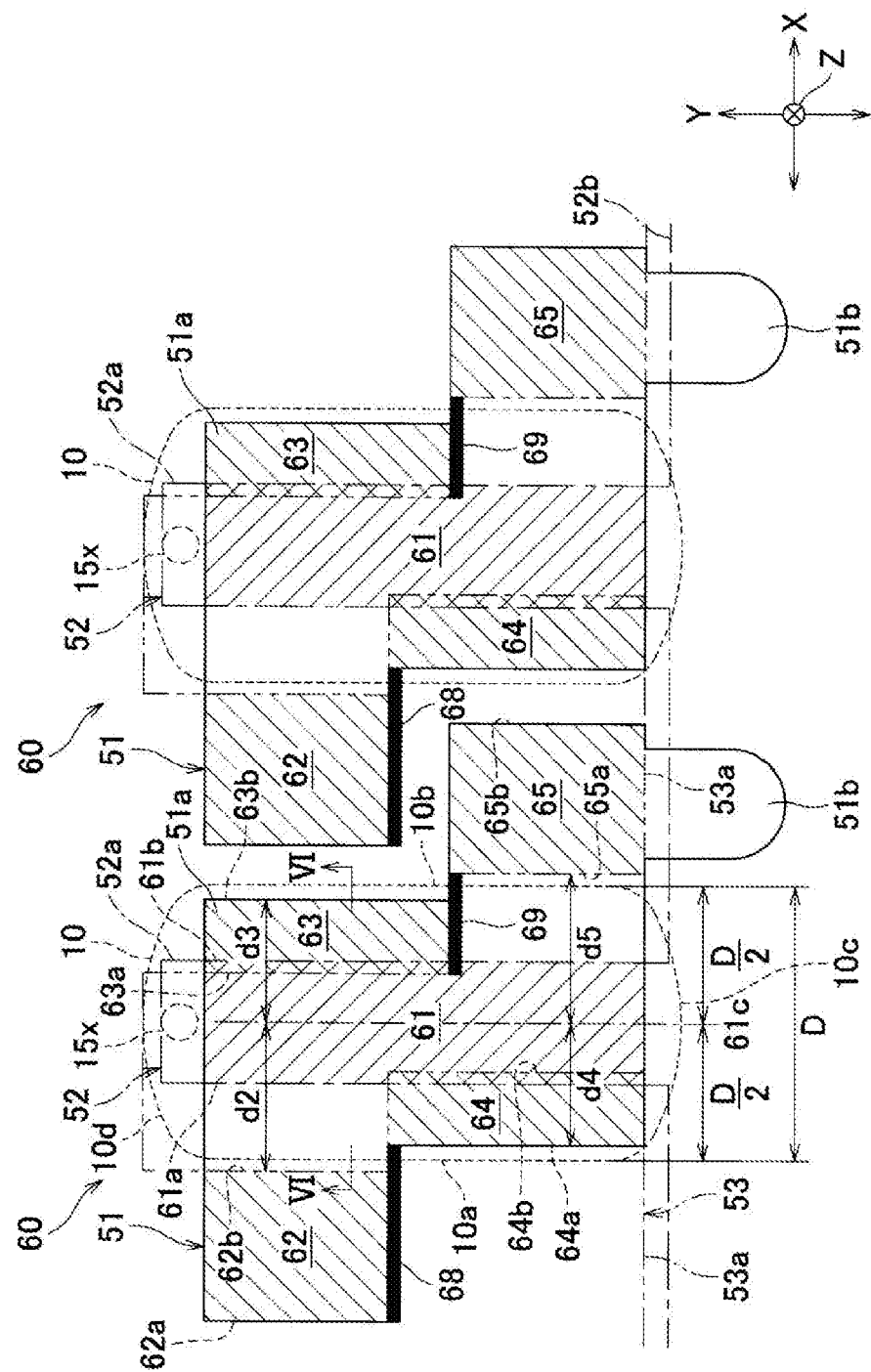
FIG. 5 is an enlarged view of an area V in FIG. 2 and FIGS. 3A to 3C.

The driving electrodes 51 that are included in 32 pieces of the driving electrode 51 and different from four driving electrodes 51 positioned at the second end 22b (upper end in FIG. 3A) of the piezoelectric actuator 22, the high potential electrode 52, and the lower potential electrode 53 have a positional relation as depicted in FIG. 5. Namely, a center portion in the X direction of each main portion 51a overlaps in the Z direction with the individual portion 52a of the high potential electrode 52 and first and second ends in the X direction of each main portion 51a overlap in the Z direction with the individual portion 53a of the low potential electrode 53. The four driving electrodes 51 positioned at the second end 22b are arranged such that a center portion in the X direction of each main portion 51a overlaps in the Z direction with the individual portion 52a of the high potential electrode 52, that the first end in the X direction of each main portion 51a overlaps in the Z direction with the individual portion 53a of the low potential electrode 53, and that the second end in the X direction of each main portions 51a overlaps in the Z direction with the connecting portion 53c of the low potential electrode 53.

A portion of the piezoelectric layer 41 interposed between the driving electrode 51 and the high potential electrode 52 in the Z direction is referred to as a first active portion 61. Portions of the piezoelectric layers 42 and 43 interposed between the driving electrode 51 and the low potential electrode 53 in the Z direction are referred to as second active portions 62 to 65. The first active portion 61 is polarized mainly upward and the second active portions 62 to 65 are polarized mainly downward.

In this embodiment, the driving electrode 51 corresponds to a first electrode, the high potential electrode 52 corresponds to a second electrode, the low potential electrode 53 corresponds to a third electrode. The first active portion 61 corresponds to a first portion, the second active portion 62 corresponds to a second portion, the second active portion 63 corresponds to a third portion, the second active portion 64 corresponds to a fourth portion, and the second active portion 65 corresponds to a fifth portion.

In the piezoelectric actuator 22, each pressure chamber 10 is provided with an actuator unit 60 formed from one first active portion 61 and four second active portions 62 to 65. The second active portions 62 to 65 have a function to inhibit crosstalk. The crosstalk is a phenomenon in which pressure variation due to deformation of the actuator unit 60 of a certain pressure chamber 10 is transmitted to another pressure chamber 10 adjacent to the certain pressure chamber 10 in the X direction.

In this embodiment, no positional shift is caused between the channel unit 21 and the piezoelectric actuator 22. A center portion 61c of each of the first active portions 61 and the center portion of the corresponding pressure chamber 10 are in the same position in the X direction.

Referring to the actuator unit 60 and the pressure chamber 10 depicted on the left side of FIG. 5, explanation is made about a positional relation between the active portions 61 to 65 of the actuator unit 60, a positional relation between the active portions 61 to 65 of the actuator unit 60 and the pressure chamber 10 corresponding thereto, and the like.

The first active portion 61 has a portion that overlaps in the Z direction with the pressure chamber 10. Specifically, the first active portion 61 overlaps in the Z direction with the center portion in the X direction of the pressure chamber 10. The first active portion 61 has a portion positioned between the second active portions 62 and 63 in the X direction, a portion positioned between the second active portions 64 and 65 in the X direction, and a portion overlapping in the Z direction with the second active portions 63 and 64.

The second active portions 62 and 63 are in the same position in the Y direction. The second active portions 64 and 65 are in the same position in the Y direction. The position in the Y direction of the second active portions 62 and 63 is different from that of the second active portions 64 and 65. Specifically, the second active portions 62 and 63 are arranged in a position, in the Y direction, between a substantially center portion and the second end 10d of the pressure chamber 10. The second active portions 64 and 65 are arranged in a position, in the Y direction, between the substantially center portion and the first end 10c of the pressure chamber 10. The second active portion 62 is separated in the X direction from the second active portion 63 and the first active portion 61 is interposed therebetween. The second active portion 64 is separated in the X direction from the second active portion 65 and the first active portion 61 is interposed therebetween. The second active portion 64 is disposed between the second active portions 62 and 63 in the X direction.

The shape and size of the second active portion 62 are the same as those of the second active portion 65 when viewed from the Z direction. The shape and size of the second active portion 63 are the same as those of the second active portion 64 when viewed from the Z direction. The length in the X direction of the second active portions 62 and 65 is longer than that of the second active portions 63 and 64.

The second active portions 62 and 65 are separated from the first active portion 61 in the X direction, and the second active portions 62 and 65 do not overlap in the Z direction with the pressure chamber 10. The second active portion 62 is positioned, in the X direction, between the first end 22a of the piezoelectric actuator 22 (see FIG. 3A) and a first end 10a (left end in FIG. 5) of the pressure chamber 10. The second active portion 65 is positioned, in the X direction, between the second end 22a of the piezoelectric actuator 22 (see FIG. 3A) and a second end 10b (right end in FIG. 5) of the pressure chamber 10. The second end 10b is positioned, in the X direction, between the first end 10a and the second end 22b of the piezoelectric actuator 22.

The second active portions 63 and 64 entirely overlap with the pressure chamber 10 in the Z direction. The second active portion 64 is positioned, in the X direction, between the first end 10a and the center portion of the pressure chamber 10. The second active portion 63 is positioned, in the X direction, between the second end 10b and the center portion of the pressure chamber 10.

The positional relation in the X direction between the pressure chamber 10 and the active portions 61 to 65 and the ends in the X direction of the piezoelectric actuator 22 is as follows.

A first end 61a and a second end 61b of the first active portion 61 are positioned between the first end 10a and the second end 10b of the pressure chamber 10. The second end 61b is positioned between the first end 61a and the second end 22b of the piezoelectric actuator 22.

A first end 62a and a second end 62b of the second active portion 62 are positioned between the first end 22a of the piezoelectric actuator 22 and the first end 10a of the pressure chamber 10. The second end 62b is positioned between the first end 62a and the second end 22b of the piezoelectric actuator 22. The second end 62b is positioned between the first end 62a and the first end 61a of the first active portion 61.

A first end 63a and a second end 63b of the second active portion 63 are positioned between the first end 10a and the second end 10b of the pressure chamber 10. The first end 63a is positioned between the first end 61a and the second end 61b of the first active portion 61 (specifically, between the center portion 61c and the second end 61b of the first active portion 61). The second end 63b is positioned between the second end 61b of the first active portion 61 and the second end 10b of the pressure chamber 10. The second end 63b is positioned between the first end 63a and the second end 22b of the piezoelectric actuator 22.

A first end 64a and a second end 64b of the second active portion 64 are positioned between the first end 10a and the second end 10b of the pressure chamber 10. The first end 64a is positioned between the first end 10a of the pressure chamber 10 and the first end 61a of the first active portion 61. The second end 64b is positioned between the first end 64a and the second end 61b of the first active portion 61 (specifically, between the first end 61a and the center portion 61c of the first active portion 61). The second end 64b is positioned between the first end 64a and the second end 22b of the piezoelectric actuator 22.

A first end 65a and a second end 65b of the second active portion 65 are positioned between the second end 10b of the pressure chamber 10 and the second end 22b of the piezoelectric actuator 22. The second end 65b is positioned between the first end 65a and the second end 22b of the piezoelectric actuator 22. The first end 65a is positioned between the second end 65b and the second end 61b of the first active portion 61.

A distance d2 in the X direction from the second end 62b of the second active portion 62 to the center portion 61c of the first active portion 61 is the same as a distance d5 in the X direction from the first end 65a of the second active portion 65 to the center portion 61c of the first active portion 61. Each of the distances d2 and d5 is longer than a half of a distance D (i.e., the length in the X direction of the pressure chamber 10), which ranges from the first end 10a to the second end 10b of the pressure chamber 10 in the X direction.

A distance d3 in the X direction from the second end 63b of the second active portion 63 to the center portion 61c of the first active portion 61 is the same as a distance d4 in the X direction from the first end 64a of the second active portion 64 to the center portion 61c of the first active portion 61. Each of the distances d3 and d4 is equal to or shorter than a half of the distance D (in this embodiment, shorter than a half of the distance D).

The piezoelectric body 40 includes a first connecting portion 68 that connects the second active portion 62 and the second active portion 64, and a second connecting portion 69 that connects the second active portion 63 and the second active portion 65. The connecting portions 68 and 69 are portions that are included in the piezoelectric layers 42 and 43 and are interposed, in the Z direction, between the driving electrode 51 and the low potential electrode 53. The first connecting portion 68 is disposed along an end in the Y direction (lower end in FIG. 5) of the second active portion 62. The length in the X direction of the first connecting portion 68 is longer than the length in the X direction of the second active portion 62. The first connecting portion 68 connects the second active portion 62 and the second active portion 64 in the X direction. The second connecting portion 69 is disposed along an end in the Y direction (lower end in FIG. 5) of the second active portion 63. The length in the X direction of the second connecting portion 69 is longer than the length in the X direction of the second active portion 63. The second connecting portion 69 connects the second active portion 63 and the second active portion 65 in the X direction. The second active portion 62 is positioned to be separated from the second active portion 64 with part of the first connecting portion 68 being interposed therebetween in the X direction, and the second active portion 62 is adjacent to the second active portion 64 in the Y direction. The second active portion 63 is positioned to be separated from the second active portion 65 with part of the second connecting portion 69 being interposed therebetween in the X direction, and the second active portion 63 is adjacent to the second active portion 65 in the Y direction.

The second active portion 65 provided for one (the left pressure chamber 10 in FIG. 5) of two pressure chambers 10 that are adjacent to each other in the X direction partially overlaps in the Y direction with the second active portion 62 provided for the other (the right pressure chamber 10 in FIG. 5). Namely, the second active portion 62 provided for the other has a portion that overlaps in the Y direction with the second active portion 65 provided for the one.

The protrusion 51b protrudes in the Y direction (a direction from the second active portion 63 to the second active portion 65) from a portion of the main portion 51a that overlaps in the Z direction with the second active portion 65.

Figure 6A:
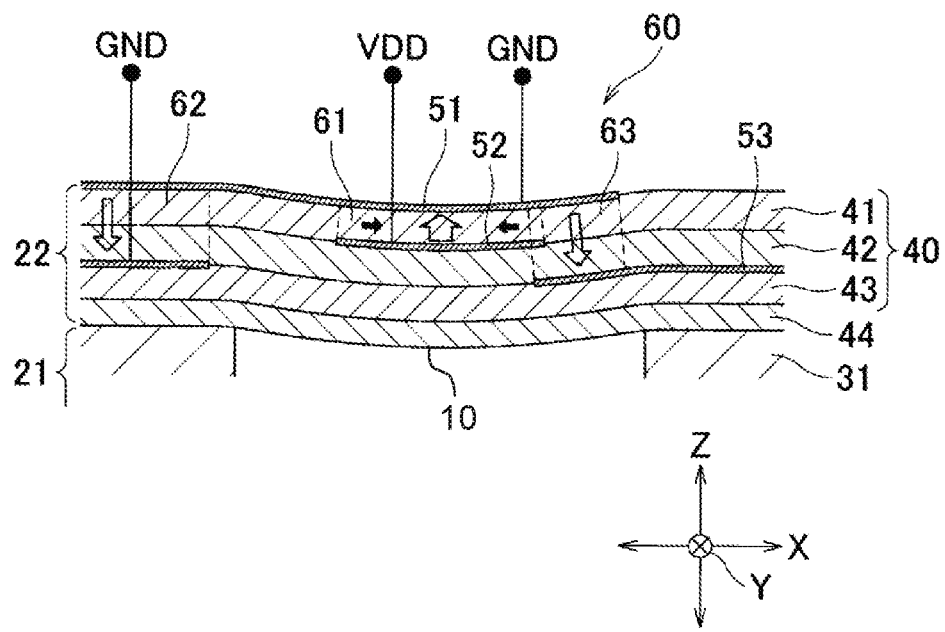
FIGS. 6A and 6B are cross-sectional views taken along a line VI-VI in FIG. 5 and each depict action of an actuator unit.
Figure 6B:
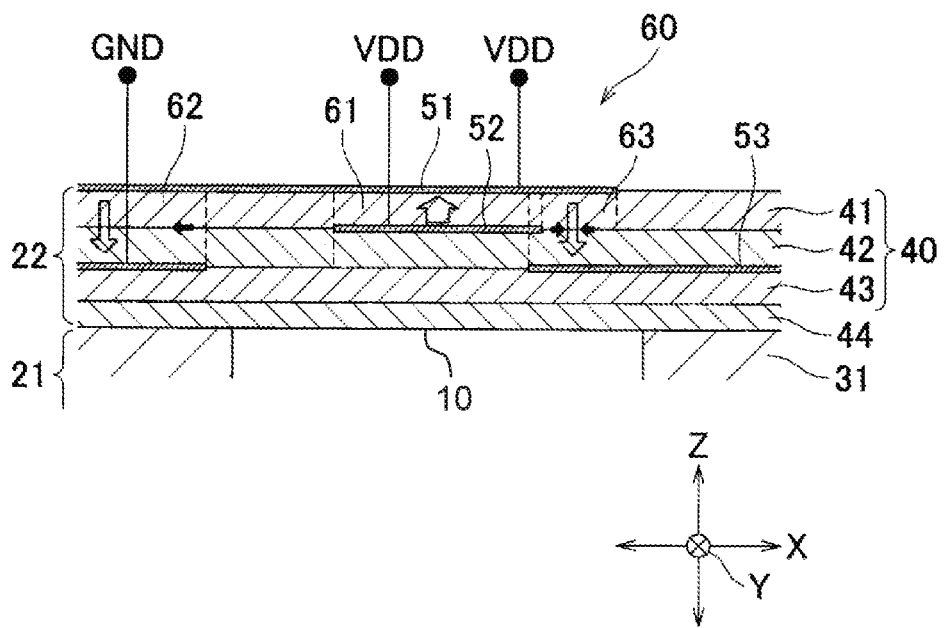

Referring to FIGS. 6A and 6B, explanation is made about action of a certain actuator unit 60, which corresponds to a certain discharge opening 15x from which ink is discharged. FIGS. 6A and 6B each depict a cross-section along the X direction and the Z direction that passes through a certain pressure chamber 10 and the active portions 61, 62, 63 of a certain actuator unit 60, which corresponds to the certain pressure chamber 10. FIGS. 6A and 6B each depict action of the second active portions 62 and 63. Cross-sections along the X direction and the Z direction that pass through a certain pressure chamber 10 and the active portions 61, 64, 65 of a certain actuator unit 60, which corresponds to the certain pressure chamber 10, show a reversed state in the X direction of FIGS. 6A and 6B. The action of the second active portions 64 and 65 is similar to that of the second active portions 63 and 62.

As depicted in FIG. 6A, the low potential (GND potential) is applied to 32 pieces of the driving electrode 51 before the printer 1 starts a recording operation. In that situation, the first active portion 61 of each of the actuator units 60 has an upward electrical field, which is identical to the polarization direction thereof, due to the difference in potential between each driving electrode 51 and the high potential electrode 52. This makes the first active portion 61 contract in a planar direction (a direction along the X direction and the Y direction). In that situation, a portion that is included in a stacked body formed from the piezoelectric body 40 and the ink separation layer 44 and overlaps in the Z direction with the pressure chamber 10 is bent toward the pressure chamber 10 to be convex downward. This makes the volume of the pressure chamber 10 smaller than that when the stacked body is flat.

When the printer 1 starts the recording operation to discharge ink from the certain discharge opening 15x, at first, the potential of the driving electrode 51 corresponding to the discharge opening 15x switches from the low potential (GND potential) to the high potential (VDD potential), as depicted in FIG. 6B. This eliminates the difference in potential between the driving electrode 51 and the high potential electrode 52 of the corresponding actuator unit 60, which eliminates the contraction of the first active portion 61. Meanwhile, the difference in potential between the driving electrode 51 and the low potential electrode 53 is generated, which causes the second active portions 62 to 65 to have a downward electrical field, which is identical to the polarization direction thereof. This makes the second active portion 62 to 65 contract in the planar direction. The second active portions 62 to 65, however, have the function to inhibit crosstalk. When no positional shift is caused between the channel unit 21 and the piezoelectric actuator 22, the contraction of the second active portions 62 to 65 hardly contributes to the deformation of the actuator unit 60. Namely, a portion of the stacked body that overlaps in the Z direction with the pressure chamber 10 is flat, instead of being in a state where the portion is bent to be convex upward in a direction away from the pressure chamber 10. This makes the volume of the pressure chamber 10 larger than that depicted in FIG. 6A.

After that, as depicted in FIG. 6A, the potential of the driving electrode 51 corresponding to the discharge opening 15x switches from the high potential (VDD potential) to the low potential (GND potential). This eliminates the difference in potential between the driving electrode 51 and the low potential electrode 53 of the corresponding actuator unit 60, which eliminates the contraction of the second active portions 62 to 65. Meanwhile, the difference in potential between the driving electrode 51 and the high potential electrode 52 is generated, which causes the first active portion 61 to have the upward electrical field, which is identical to the polarization direction thereof. This makes the first active portion 61 contract in the planar direction. Thus, the portion that is included in the stacked body and overlaps in the Z direction with the pressure chamber 10 is bent toward the pressure chamber 10 to be convex downward. This greatly reduces the volume of the pressure chamber 10 and great pressure is applied to ink in the pressure chamber 10. Accordingly, the ink is discharged from the discharge opening 15x.

As described above, the head 3 according to this embodiment satisfies the following condition. Namely, the second end 62b of the second active portion 62 is positioned, in the X direction, between the first end 62a of the second active portion 62 and the first end 61a of the first active portion 61, and the first end 63a of the second active portion 63 is positioned, in the X direction, between the first end 61a and the second end 61b of the first active portion 61 (see FIG. 5). When the above condition is satisfied, the second active portion 62 may have a drive deterioration as shown in an experimental result described below. However, a drive deterioration of the entire actuator unit 60 may be inhibited because the deformation amount of the second active portion 63 increases as its deformation count increases. Namely, satisfying the above condition inhibits the drive deterioration of the actuator unit 60.

Further, the head 3 according to this embodiment satisfies the following condition. Namely, the first end 65a of the second active portion 65 is positioned, in the X direction, between the second end 61b of the first active portion 61 and the second end 65b of the second active portion 65, and the second end 64b of the second active portion 64 is positioned, in the X direction, between the first end 61a and the second end 61b of the first active portion 61 (see FIG. 5). When the above condition is satisfied, the second active portion 65 may have a drive deterioration as shown in the experimental result described below. However, the deformation amount of the actuator unit 60 due to the contraction of the second active portion 64 increases as the deformation count of the actuator unit 60 increases. Further, in this configuration, since the second active portions 63 and 64 that inhibit the drive deterioration are arranged in the Y direction, the drive deterioration of the actuator unit 60 in the Y direction is inhibited.

In the pressure chamber 10, the length in the Y direction is longer than the length in the X direction (see FIG. 5). In that case, it is possible to inhibit the drive deterioration of the actuator unit 60 in the Y direction, which is the longitudinal direction of the pressure chamber 10. This results in stable discharge performance of the printer 1.

The distance d2 in the X direction from the second end 62b of the second active portion 62 to the center portion 61c of the first active portion 61 and the distance d5 in the X direction from the first end 65a of the second active portion 65 to the center portion 61c of the first active portion 61 are longer than a half of the distance D in the X direction from the first end 10a to the second end 10b of the pressure chamber 10. The distance d3 in the X direction from the center portion 61c of the first active portion 61 to the second end 63b of the second active portion 63 and the distance d4 in the X direction from the center portion 61c of the first active portion 61 to the first end 64a of the second active portion 64 are equal to or shorter than a half of the distance D (see FIG. 5). The above configuration inhibits the decrease in deformation amount of the actuator unit 60 that may otherwise be caused by the positional shift, in the X direction, between the channel unit 21 and the piezoelectric actuator 22. In the following, the effects thereof are explained in detail.

Figure 7A:
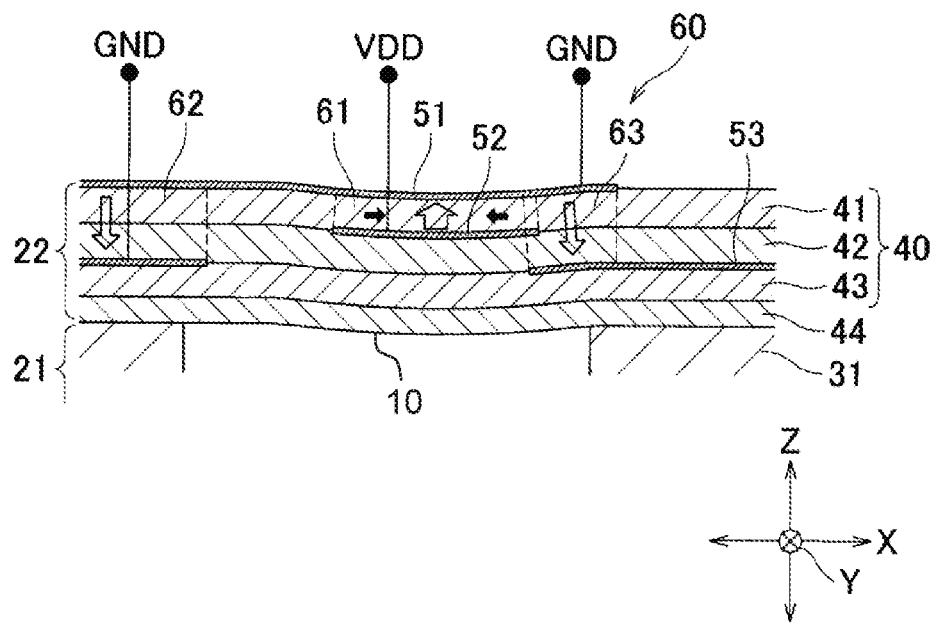
FIGS. 7A and 7B correspond to FIGS. 6A and 6B and each depict action of the actuator unit when a positional shift in an X direction is caused.
Figure 7B:
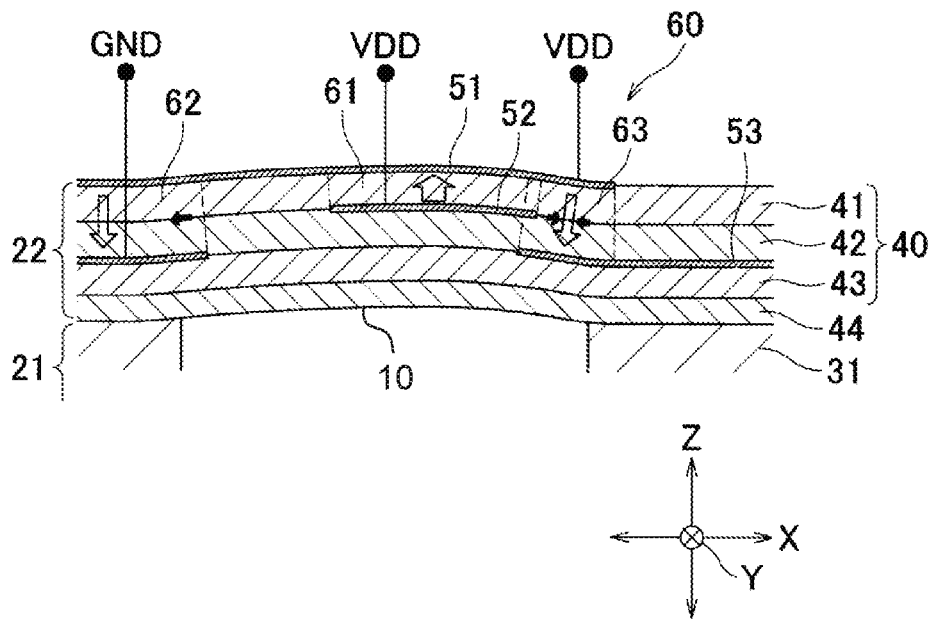

FIGS. 7A and 7B each depict an example in which the piezoelectric actuator 22 is shifted rightward in FIG. 5, wherein the second active portion 62 partially overlaps in the Z direction with the pressure chamber 10. Namely, the second active portion 62 has a position that overlaps in the Z direction with the pressure chamber 10 and a portion that does not overlap in the Z direction with the pressure chamber 10. The second active portion 63 has a portion that overlaps in the Z direction with the pressure chamber 10 and a portion that does not overlap in the Z direction with the pressure chamber 10. The second active portion 64 is closer to the center portion in the X direction of the pressure chamber 10 and the second active portion 65 is farther away from the pressure chamber 10 in the X direction, when compared to the piezoelectric actuator 22 which is not shifted rightward.

In the examples depicted in FIGS. 7A and 7B, the contraction of the first active portion 61 (FIG. 7A) and the contraction of the second active portions 62 to 65 (FIG. 7B) are sequentially generated depending on the change in potential of the driving electrode 51, similar to the examples depicted in FIGS. 6A and 6B. As understood from analysis results described below, however, the downward deformation amount of the actuator unit 60 due to the contraction of the first active portion 61 is smaller, and the upward deformation amount of the actuator unit 60 due to the contraction of the second active portions 62 and 63 is larger, when compared to a case having no positional shift (FIGS. 6A and 6B). Namely, the deformation amount of the actuator unit 60 due to the contraction of the first active portion 61 when the positional shift in the X direction is caused, is smaller than that when no positional shift is caused. Meanwhile, the deformation amount of the actuator unit 60 due to the contraction of the second active portions 62 and 63 when the positional shift in the X direction is caused, is larger than that when no positional shift is caused (FIG. 7B). This inhibits the decrease in deformation amount of the entire actuator unit 60.

In contrast to the examples depicted in FIGS. 7A and 7B, when the piezoelectric actuator 22 is shifted leftward in FIG. 5 and the second active portions 64 and 65 each have a portion that overlaps in the Z direction with the pressure chamber 10 and a portion that does not overlap in the Z direction with the pressure chamber 10, the deformation amount of the actuator unit 60 due to the contraction of the second active portions 64 and 65 is large. Specifically, the deformation amount of the first active portion 61 is smaller and the deformation amount of the second active portions 64 and 65 is larger than the case having no positional shift. Namely, the deformation amount of the actuator unit 60 due to the contraction of the first active portion 61 when the positional shift in the X direction is caused, is smaller than that when no positional shift is caused. Meanwhile, the deformation amount of the actuator unit 60 due to the contraction of the second active portions 64 and 65 when the positional shift in the X direction is caused, is larger than that when no positional shift is caused. This inhibits the decrease in deformation amount of the entire actuator unit 60.

In this embodiment, the driving electrode 51, the high potential electrode 52, the low potential electrode 53, the first active portion 61, and the second active portions 62 to 65 that are provided for the left pressure chamber 10 in FIG. 5 respectively correspond to the first electrode, the second electrode, the third electrode, the first portion, and the second to fifth portions of the present teaching. In this embodiment, the driving electrode 51, the high potential electrode 52, the lower potential electrode 53, the first active portion 61, and the second active portions 62 to 65 that are provided for the right pressure chamber 10 in FIG. 5 respectively correspond to a fourth electrode, a fifth electrode, a sixth electrode, a sixth portion, and seventh to tenth portions of the present teaching. The second active portion 62 provided for the right pressure chamber 10 in FIG. 5 has a portion that overlaps in the Y direction with the second active portion 65 provided for the left pressure chamber 10 in FIG. 5. In that case, the proportion of the second active portions 62 and 65 to an area between two pressure chambers 10, which are adjacent to each other in the X direction, is larger than a case in which the second active portion 62 does not overlap in the Y direction with the second active portion 65. This reliably allows the second active portions 62 and 65 to inhibit the cross talk. The crosstalk is a phenomenon in which pressure variation due to deformation of the actuator unit 60 of a certain pressure chamber 10 is transmitted to another pressure chamber 10 adjacent to the certain pressure chamber 10 in the X direction.

When the protrusion 51b has a portion that overlaps in the Z direction with the pressure chamber 10, the deformation of the actuator unit 60 may be inhibited. In this configuration, the protrusion 51b is disposed such that the whole of the protrusion 51b does not overlap in the Z direction with the pressure chamber 10 (see FIG. 5). This solves the above problem.

The piezoelectric body 40 includes the first connecting portion 68 that connects the second active portion 62 and the second active portion 64 and the second connecting portion 69 that connects the second active portion 63 and the second active portion 65. In that configuration, when the positional shift in the Y direction is caused between the driving electrode 51 and the low potential electrode 53, an area in the X direction having no second active portions is not likely to be generated, thus maintaining the crosstalk inhibition effect of the second active portions. Specifically, when the position of the driving electrode 51 is shifted upward in FIG. 5, and when the positional shift amount is less than the length in the Y direction of the first connecting portion 68, the first connecting portion 68 is maintained. Or, when the position of the driving electrode 51 is shifted downward in FIG. 5, and when the positional shift amount is less than the length in the X direction of the second connecting portion 69, the second connecting portion 69 is maintained. An area that is included in the piezoelectric body 40 and is not interposed between the electrodes is likely to crack easily. This configuration, however, can inhibit cracks.

The first end 63a of the second active portion 63 satisfies the condition "positioned, in the X direction, between the first end 61a and the second end 61b of the first active portion 61" (see FIG. 5). When the above condition is satisfied, as shown in the experimental result described below, the deformation amount of the actuator unit 60 due to the contraction of the second active portion 63 reliably increases as the deformation count of the actuator unit 60 increases. This reliably inhibits the drive deterioration of the actuator unit 60.

Second Embodiment

Subsequently, referring to FIGS. 8 to 12, explanation is made about a head of the second embodiment of the present teaching.

Figure 8:
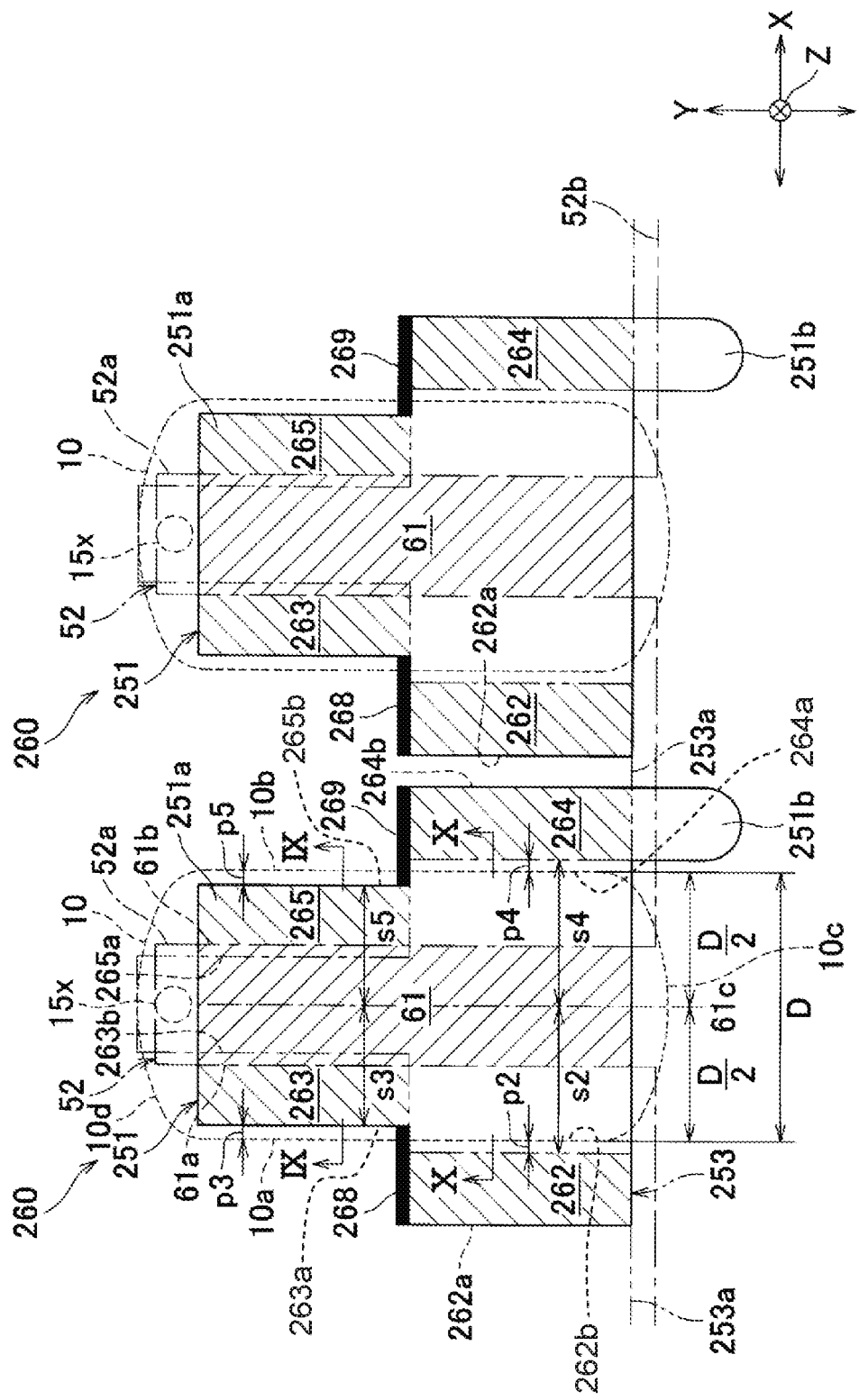
FIG. 8 is a plan view of a head according to a second embodiment of the present teaching that corresponds to FIG. 5.

As depicted in FIG. 8, 32 pieces of drive electrode 251 and 32 pieces of individual portion 253a of a low potential electrode 253 according to the second embodiment have shapes different from those in the first embodiment (FIG. 5). Thus, in the second embodiment, the arrangement and shapes of second active portions 262 to 265 are different from those in the first embodiment.

Each of the driving electrodes 251 has a main portion 251a and a protrusion 251b. The main portion 251a has a protruding shape when viewed from the Z direction. The main portion 251a has a portion that overlaps in the Z direction with the corresponding pressure chamber 10 and a portion that does not overlap in the Z direction with the corresponding pressure chamber 10. The protrusion 251b protrudes from the main portion 251a in the Y direction. The whole of the protrusion 251b does not overlap in the Z direction with the corresponding pressure chamber 10. The protrusions 251b of 32 pieces of the driving electrode 251 have the same protruding direction. The protrusions 251b have contacts that electrically connect to traces of the COF 23 (FIG. 2).

Referring to an actuator unit 260 and the pressure chamber 10 depicted on the left side of FIG. 8, explanation is made about a positional relation between the active portions 61, 262 to 265 of the actuator unit 260, a positional relation between the active portions 61, 262 to 265 of the actuator unit 260 and the pressure chamber 10 corresponding thereto, and the like.

The first active portion 61 has a portion that is positioned, in the X direction, between the second active portions 263 and 265, a portion that is positioned, in the X direction, between the second active portions 262 and 264, and a portion that overlaps in the Z direction with the second active portions 263 and 265.

The second active portions 263 and 265 are in the same position in the Y direction. The second active portions 262 and 264 are in the same position in the Y direction. The position in the Y direction of the second active portions 263 and 265 is different from that of the second active portions 262 and 264. Specifically, the second active portions 262 and 264 are arranged in a position, in the Y direction, between a substantially center portion and the first end 10c of the pressure chamber 10. The second active portions 263 and 265 are arranged in a position, in the Y direction, between the substantially center portion and the second end 10d of the pressure chamber 10. The second active portion 262 is separated from the second active portion 264 in the X direction and the first active portion 61 is interposed therebetween. The second active portion 263 is separated from the second active portion 265 in the X direction and the first active portion 61 is interposed therebetween.

The second active portion 263 has a portion that is positioned, in the X direction, between the second active portion 262 and the first active portion 61. The second active portion 265 has a portion that is positioned, in the X direction, between the first active portion 61 and the second active portion 264. The second active portion 264 is positioned, in the X direction, between the second active portion 262 and the second end 22b (see FIG. 3) of the piezoelectric actuator 22. The second active portion 265 is positioned, in the X direction, between the second active portion 263 and the second end 22b of the piezoelectric actuator 22.

The second active portions 262 to 265 have the same size and the same shape when viewed from the Z direction.

Each of the second active portions 263 and 265 entirely overlaps in the Z direction with the pressure chamber 10. The second active portion 263 is positioned, in the X direction, between the first end 10a and the center portion of the pressure chamber 10. The second active portion 265 is positioned, in the X direction, between the second end 10b and the center portion of the pressure chamber 10.

The second active portions 262 and 264 are separated from the first active portion 61 in the X direction, and they do not overlap with the pressure chamber 10 in the Z direction. The second active portion 262 is positioned, in the X direction, between the first end 22a of the piezoelectric actuator 22 (see FIG. 3) and the first end 10a (the left end in FIG. 8) of the pressure chamber 10. The second active portion 264 is positioned, in the X direction, between the second end 10b (the right end in FIG. 8) of the pressure chamber 10 and the second end 22b (see FIG. 3) of the piezoelectric actuator 22.

The positional relations in the X direction between ends of the pressure chamber 10 and ends of the active portions 61, 262 to 265 and ends of the piezoelectric actuator 22 are as follows.

A first end 263a and a second end 263b of the second active portion 263 are positioned between the first end 10a and the second end 10b of the pressure chamber 10. The first end 263a is positioned between the first end 10a of the pressure chamber 10 and the first end 61a of the first active portion 61. The second end 263b is positioned between the first end 61a and the second end 61b of the first active portion 61 (specifically, between the center portion 61c and the first end 61a of the first active portion 61). The second end 263b is positioned between the first end 263a and the second end 22b of the piezoelectric actuator 22.

A first end 265a and a second end 265b of the second active portion 265 are positioned between the first end 10a and the second end 10b of the pressure chamber 10. The first end 265a is positioned between the first end 61a and the second end 61b of the first active portion 61 (specifically, the center portion 61c and the second end 61b of the first active portion 61). The second end 265b is positioned between the second end 61b of the first active portion 61 and the second end 10b of the pressure chamber 10. The second end 265b is positioned between the first end 265a and the second end 22b of the piezoelectric actuator 22.

A first end 262a and a second end 262b of the second active portion 262 are positioned between the first end 22a of the piezoelectric actuator 22 and the first end 10a of the pressure chamber 10. The second end 262b is positioned between the first end 262a and the second end 22b of the piezoelectric actuator 22. The second end 262b is positioned between the first end 262a and the first end 61a of the first active portion 61.

A first end 264a and a second end 264b of the second active portion 264 are positioned between the second end 10b of the pressure chamber 10 and the second end 22b of the piezoelectric actuator 22. The second end 264b is positioned between the first end 264a and the second end 22b of the piezoelectric actuator 22. The first end 264a is positioned between the second end 61b of the first active portion 61 and the second end 264b.

A distance s3 in the X direction from the first end 263a of the second active portion 263 to the center portion 61c of the first active portion 61 is the same as a distance s5 in the X direction from the second end 265b of the second active portion 265 to the center portion 61c of the first active portion 61. Each of the distances s3 and s5 is equal to or shorter than a half of a distance D (i.e., the length in the X direction of the pressure chamber 10), which ranges from the first end 10a to the second end 10b of the pressure chamber 10 in the X direction (in this embodiment, each of the distances s3 and s5 is shorter than a half of the distance D).

A distance s2 in the X direction from the second end 262b of the second active portion 262 to the center portion 61c of the first active portion 61 is the same as a distance s4 in the X direction from the first end 264a of the second active portion 264 to the center portion 61c of the first active portion 61. Each of the distances s2 and s4 is longer than a half of the distance D.

The piezoelectric body 40 includes a first connecting portion 268 that connects the second active portion 262 and the second active portion 263, and a second connecting portion 269 that connects the second active portion 264 and the second active portion 265. The connecting portions 268 and 269 are portions that are included in the piezoelectric layers 42 and 43 and are interposed, in the Z direction, between the driving electrode 251 and the low potential electrode 253. The first connecting portion 268 is disposed along an end (upper end in FIG. 8) in the Y direction of the second active portion 262. The length in the X direction of the first connecting portion 268 is longer than the length in the X direction of the second active portion 262. The first connecting portion 268 connects the second active portion 262 and the second active portion 263 in the X direction. The second connecting portion 269 is disposed along an end (upper end in FIG. 8) in the Y direction of the second active portion 264. The length in the X direction of the second connecting portion 269 is longer than the length in the X direction of the second active portion 264. The second connecting portion 269 connects the second active portion 264 and the second active portion 265 in the X direction. The second active portion 262 is positioned to be separated from the second active portion 263 with part of the first connecting portion 268 being interposed therebetween in the X direction, and the second active portion 262 is adjacent to the second active portion 263 in the Y direction. The second active portion 264 is positioned to be separated from the second active portion 265 with part of the second connecting portion 269 being interposed therebetween in the X direction, and the second active portion 264 is adjacent to the second active portion 265 in the Y direction.

The second active portion 264 provided for one (left pressure chamber 10 in FIG. 8) of two pressure chambers 10 adjacent to each other in the X direction is separated in the X direction from the second active portion 262 provided for the other (right pressure chamber 10 in FIG. 8).

The protrusion 251b protrudes in the Y direction (a direction from the second active portion 265 toward the second active portion 264) from a portion of the main portion 251a overlapping in the Z direction with the second active portion 264.

Referring to FIGS. 9A to 10B, explanation is made about action of a certain actuator unit 260, which corresponds to a certain discharge opening 15x from which ink is discharged.

Figure 9A:
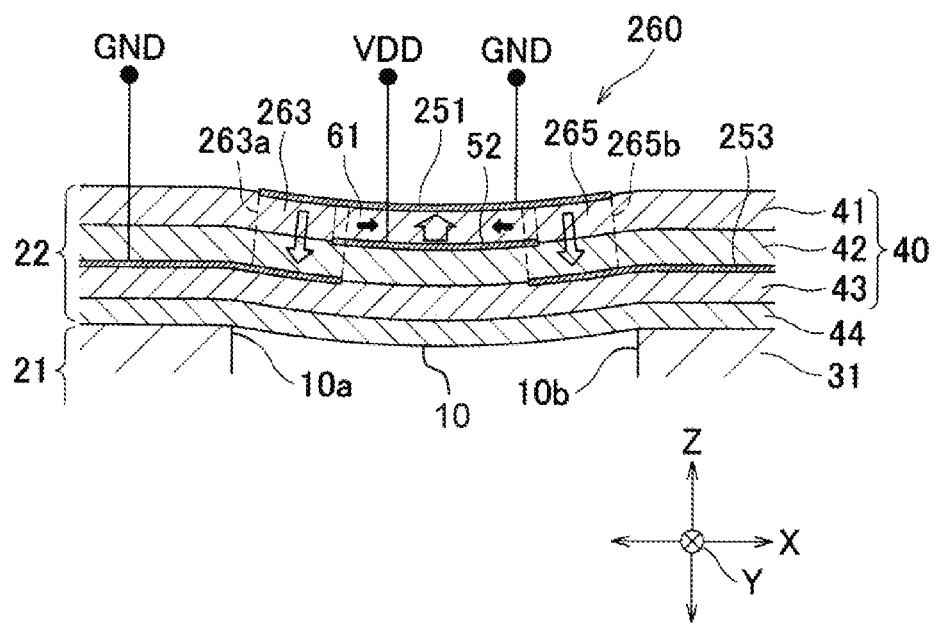
FIGS. 9A and 9B are cross-sectional views taken along a line IX-IX in FIG. 8 and each depict action of the actuator unit.
Figure 9B:
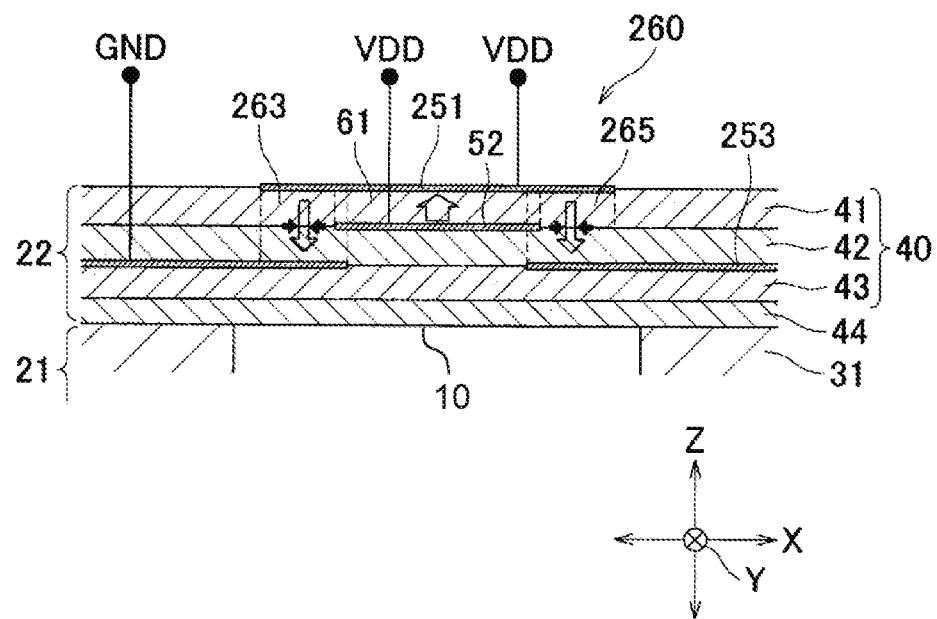
Figure 10A:
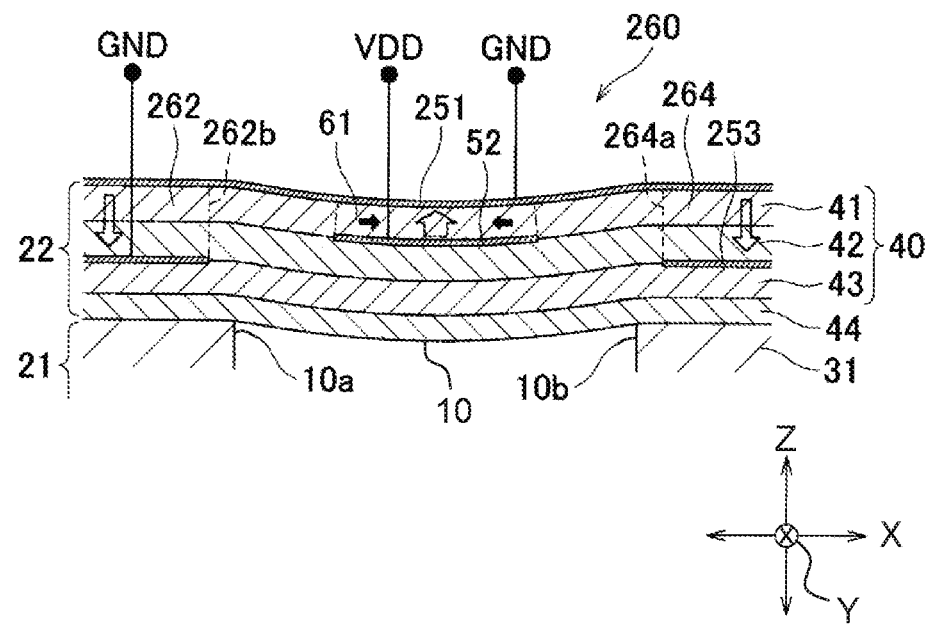
FIGS. 10A and 10B are cross-sectional views taken along a line X-X in FIG. 8 and each depict action of the actuator unit.
Figure 10B:
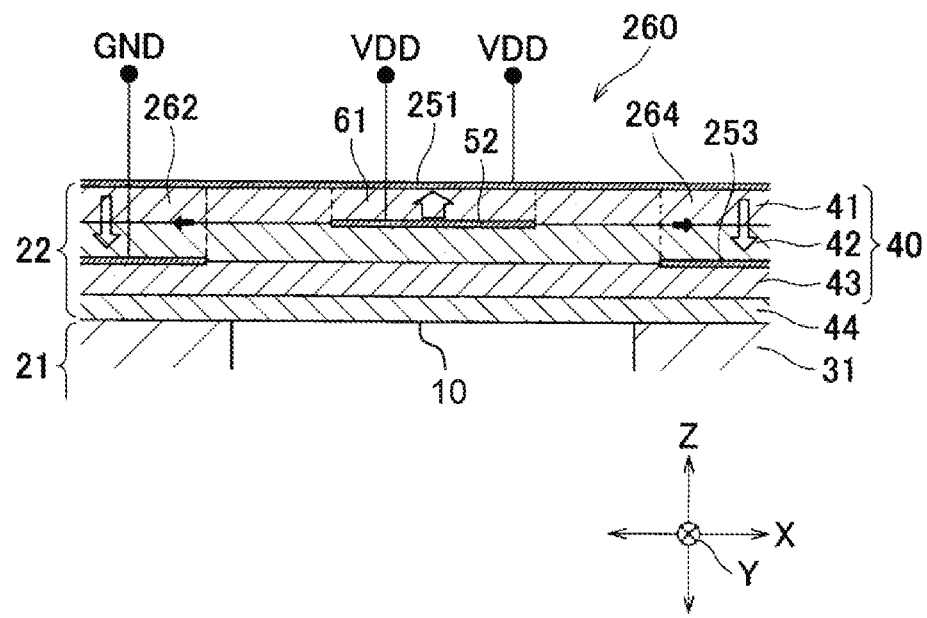
Figure 11A:
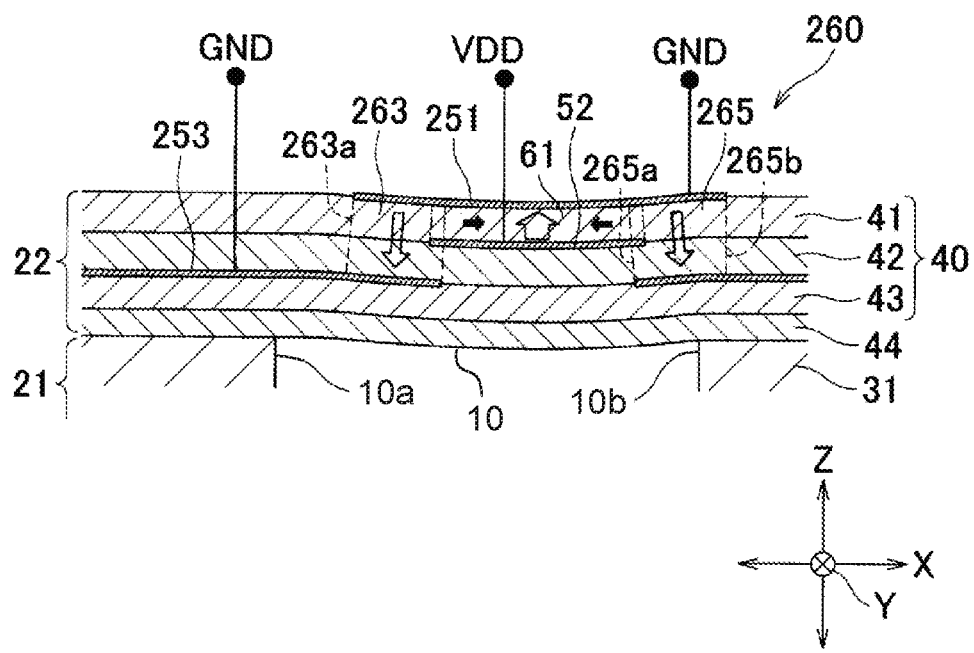
FIGS. 11A and 11B correspond to FIGS. 9A and 9B and each depict action of the actuator unit when a positional shift in the X direction is caused.
Figure 11B:
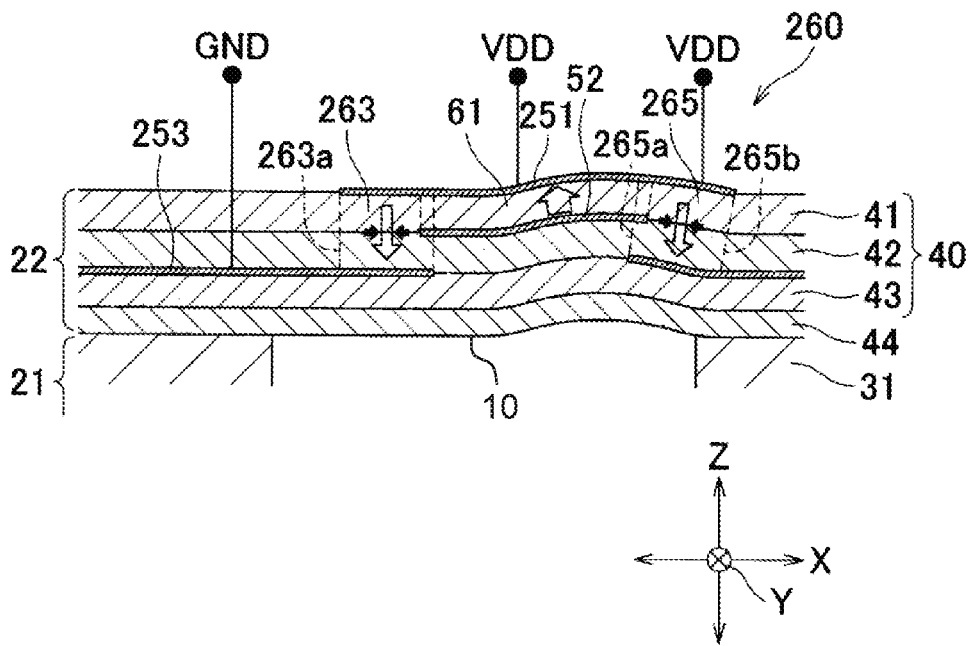

FIGS. 9A and 9B each depict a cross-section along in the X direction and the Z direction that passes through a certain pressure chamber 10 and the active portions 61, 263, 265 of a certain actuator unit 260, which corresponds to the certain pressure chamber 10. FIGS. 10A and 10B each depict a cross-section along the X direction and the Z direction that passes through a certain pressure chamber 10 and the active portions 61, 262, 264 of a certain actuator unit 260, which corresponds to the certain pressure chamber 10.

As depicted in FIGS. 9A and 10A, the low potential (GND potential) is applied to 32 pieces of the drive electrode 251 before the printer 1 starts a recording operation. In that situation, the first active portion 61 of each of the actuator units 260 has an upward electrical field, which is identical to the polarization direction thereof, due to the difference in potential between each driving electrode 251 and the high potential electrode 52. This makes the first active portion 61 contract in a planar direction (a direction along the X direction and the Y direction). In that situation, a portion that is included in the stacked body formed from the piezoelectric body 40 and the ink separation layer 44 and that overlaps in the Z direction with the pressure chamber 10 is bent toward the pressure chamber 10 to be convex downward. This makes the volume of the pressure chamber 10 smaller than that when the stacked body is flat.

When the printer 1 starts the recording operation to discharge ink from the certain discharge opening 15x, at first, the potential of the driving electrode 251 corresponding to the discharge opening 15x switches from the low potential (GND potential) to the high potential (VDD potential), as depicted in FIGS. 9B and 10B. This eliminates the difference in potential between the driving electrode 251 and the high potential electrode 52 of the corresponding actuator unit 260, which eliminates the contraction of the first active portion 61. Meanwhile, the difference in potential between the driving electrode 251 and the low potential electrode 253 is generated, which causes the second active portions 262 to 265 to have a downward electrical field, which is identical to the polarization direction thereof. This makes the second active portions 262 to 265 contract in the planar direction. Thus, the portion that is included in the stacked body and overlaps in the Z direction with the pressure chamber 10 is bent in a direction away from the pressure chamber 10 to be convex upward. This increases the volume of the pressure chamber 10.

After that, as depicted in FIGS. 9A and 10A, the potential of the driving electrode 251 corresponding to the discharge opening 15x switches from the high potential (VDD potential) to the low potential (GND potential). This eliminates the difference in potential between the driving electrode 251 and the low potential electrode 253 of the corresponding actuator unit 260, which eliminates the contraction of the second active portions 262 to 265. Meanwhile, the difference in potential between the driving electrode 251 and the high potential electrode 52 is generated, which causes the first active portion 61 to have the upward electrical field, which is identical to the polarization direction thereof. This makes the first active portion 61 contract in the planar direction. Thus, the portion that is included in the stacked body and overlaps in the Z direction with the pressure chamber 10 is bent toward the pressure chamber 10 to be convex downward. This greatly reduces the volume of the pressure chamber 10 and applies great pressure to ink in the pressure chamber 10, thus discharging ink from the discharge opening 15x.

As described above, the head of the second embodiment satisfies the following condition. Namely, the second end 262b of the second active portion 262 is positioned, in the X direction, between the first end 61a of the first active portion 61 and the first end 262a of the second active portion 262, and the second end 263b of the second active portion 263 is positioned, in the X direction, between the first end 61a and the second end 61b of the first active portion 61 (see FIG. 8). When the above condition is satisfied, the second active portion 262 may have a drive deterioration as shown in the experimental result described below. However, a drive deterioration of the entire actuator unit 260 may be inhibited because the deformation amount of the actuator unit 260 due to the contraction of the second active portion 263 increases as the deformation count of the actuator unit 260 increases. Namely, satisfying the above condition inhibits the drive deterioration of the actuator unit 260.

The head according to the second embodiment satisfies the following condition. Namely, the first end 264a of the second active portion 264 is positioned, in the X direction, between the second end 61b of the first active portion 61 and the second end 264b of the second active portion 264, and the first end 265a of the second active portion 265 is positioned, in the X direction, between the first end 61a and the second end 61b of the first active portion 61 (see FIG. 8). When the above condition is satisfied, the second active portion 264 may have a drive deterioration as shown in the experimental result described below. However, a drive deterioration of the entire actuator unit 260 may be inhibited because the deformation amount of the actuator unit 260 due to the contraction of the second active portion 265 increases as the deformation count of the actuator unit 260 increases. Namely, satisfying the above condition inhibits the drive deterioration of the actuator unit 260.

The second active portions 263 and 265 are closer to the discharge opening 15x in the Y direction than the second active portions 262 and 264 (see FIG. 8). In that case, the drive deterioration in an area included in the actuator unit 260 and close to the discharge opening 15x can be inhibited, thus maintaining stable discharge performance A distance (s2+s4) in the X direction from the second end 262b of the second active portion 262 to the first end 264a of the second active portion 264 is longer than the distance D in the X direction from the first end 10a to the second end 10b of the pressure chamber 10. A distance (s3+s5) in the X direction from the first end 263a of the second active portion 263 to the second end 265b of the second active portion 265 is equal to or less than the distance D (see FIG. 8). In the above case, it is possible to inhibit the decrease in the deformation amount of the actuator unit 260 due to the positional shift in the X direction between the channel unit 21 and the piezoelectric actuator 22. The reason thereof is specifically explained below.

FIGS. 11A to 12B each depict a state in which the position of the piezoelectric actuator 22 is shifted rightward in FIG. 8, wherein the second active portions 265 and 262 partially overlap in the Z direction with the pressure chamber 10. Namely, each of the second active portions 265 and 262 has a portion that overlaps in the Z direction with the pressure chamber 10 and a portion that does not overlap in the Z direction with the pressure chamber 10. The second active portion 263 is closer to the pressure chamber 10, and the second active portion 264 is further separated from the pressure chamber 10, when compared to the piezoelectric actuator 22 which is not shifted rightward.

Figure 12A:
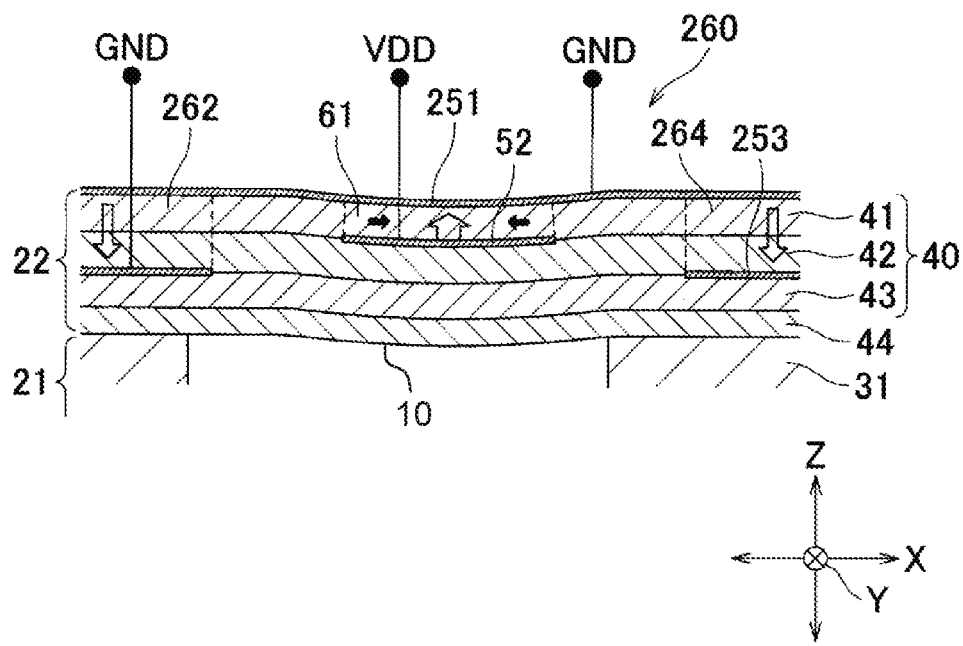
FIGS. 12A and 12B correspond to FIGS. 10A and 10B and each depict action of the actuator unit when a positional shift in the X direction is caused.
Figure 12B:
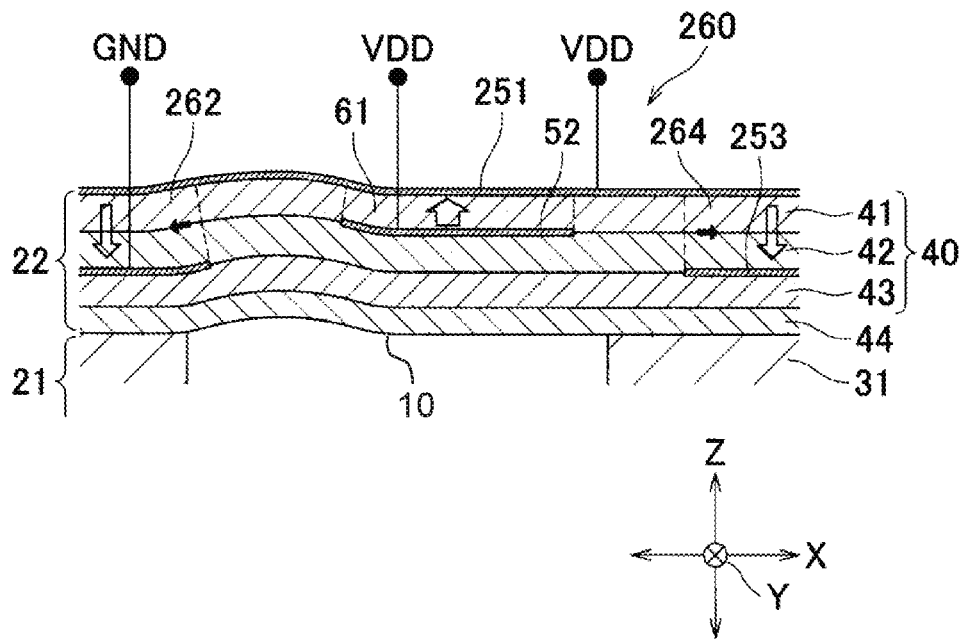

In the cases depicted in FIGS. 11A to 12B, the contraction of the first active portion 61 (FIG. 11A and FIG. 12A) and the contraction of the second active portions 262 to 265 (FIGS. 11B and 12B) are sequentially generated depending on the change in the potential of the driving electrode 251, similar to the cases depicted in FIGS. 9A to 10B. However, as understood from the analysis result described below, the downward deformation amount of the actuator unit 260 due to the contraction of the first active portion 61 when the positional shift is caused, is smaller than that when no positional shift is caused (FIGS. 9A to 10B). Meanwhile, the upward deformation amount of the actuator unit 260 due to the contraction of the second active portions 265 and 262 when the positional shift is caused, is larger than that when no positional shift is caused (FIGS. 9A to 10B). Namely, the deformation amount of the actuator unit 260 due to the contraction of the first active portion 61 when the positional shift in the X direction is caused, is smaller than that when no positional shift in the X direction is caused. Meanwhile, the deformation amount of the actuator unit 260 due to the contraction of the second active portions 265 and 262 when the positional shift in the X direction is caused, is larger than that when no positional shift in the X direction is caused (FIGS. 11B and 12B). This inhibits the decrease in deformation amount of the entire actuator unit 260.

Contrary to FIGS. 11A to 12B, the position of the piezoelectric actuator 22 may shift leftward in FIG. 8 and each of the second active portions 263 and 264 may have a portion that overlaps in the Z direction with the pressure chamber 10 and a portion that does not overlap in the Z direction with the pressure chamber 10. In that case, the deformation amount of the actuator unit 260 due to the contraction of the second active portions 263 and 264 increases. Specifically, the downward deformation amount of the actuator unit 260 due to the contraction of the first active portion 61 when the positional shift is caused, is smaller than that when no positional shift is caused. Meanwhile, the upward deformation amount of the actuator unit 260 due to the contraction of the second active portions 263 and 264 when the positional shift is caused, is larger than that when no positional shift is caused. Namely, the deformation amount of the actuator unit 260 due to the contraction of the first active portion 61 when the positional shift in the X direction is caused, is smaller than that when no positional shift in the X direction is caused. Meanwhile, the deformation amount of the actuator unit 260 due to the contraction of the second active portions 263 and 264 when the positional shift in the X direction is caused, is larger than that when no positional shift in the X direction is caused. This inhibits the decrease in the deformation amount of the entire actuator unit 260.

In the pressure chamber 10, the length in the Y direction is longer than the length in the X direction (see FIG. 8). When the positional shift between the channel unit 21 and the piezoelectric actuator 22 is caused in the X direction, which is a width direction of the pressure chamber 10, the decrease in the deformation amount of the actuator unit 260 may be conspicuous. The configuration of the second embodiment solves that problem.

When the protrusion 251b has a portion that overlaps in the Z direction with the pressure chamber 10, the deformation of the actuator unit 260 may be inhibited. In this configuration, the protrusion 251b is disposed such that the whole of the protrusion 251b does not overlap in the Z direction with the pressure chamber 10 (see FIG. 8). This solves that problem.

The piezoelectric body 40 includes the first connecting portion 268 that connects the second active portion 262 and the second active portion 263, and the second connecting portion 269 that connects the second active portion 264 and the second active portion 265. In that case, when the positional shift in the Y direction is caused between the driving electrode 251 and the low potential electrode 253, an area in the X direction having no second active portions is not likely to appear, thus maintaining the crosstalk inhibition effect of the second active portions. Specifically, for example, the position of the driving electrode 251 may be shifted downward in FIG. 8. In that case, when the positional shift amount is less than a length in the Y direction of the connecting portions 268 and 269, the connecting portion 268 and 269 are maintained. An area that is included in the piezoelectric body 40 and is not interposed between the electrodes is likely to crack easily. This configuration, however, can inhibit cracks.

The second end 263b of the second active portion 263 satisfies the following condition. Namely, the second end 263b of the second active portion 263 is positioned, in the X direction, between the first end 61a and the second end 61b of the first active portion 61 (see FIG. 8). In that case, as shown in the experimental result described below, the deformation amount of the actuator unit 260 due to the contraction of the second active portion 263 reliably increases as the deformation count of the actuator unit 260 increases. This reliably inhibits the drive deterioration of the actuator unit 260.

<Drive Deterioration Experiment>

The inventor of the present application conducted an experiment to test a drive deterioration of the actuator unit by using a head with an IN-type actuator unit (i.e., an actuator unit that has the cross-section along the Y direction as depicted in FIG. 9A, includes the second active portions 263 and 265 in FIG. 8, and does not include the second active portions 262 and 264 in FIG. 8) and a head with an OUT-type actuator unit (i.e., an actuator unit that has the cross-section along the Y direction as depicted in FIG. 10A, includes the second active portions 262 and 264 in FIG. 8, and does not include the second active portions 263 and 265 in FIG. 8).

In the experiment using the IN-type actuator unit (FIGS. 9A and 9B), the first end 263a of the second active portion 263 had the same position, in the X direction, as the first end 10a of the pressure chamber 10, and the second end 265b of the second active portion 265 had the same position, in the X direction, as the second end 10b of the pressure chamber 10. In the experiment using the OUT-type actuator unit (FIGS. 10A and 10B), the second end 262b of the second active portion 262 had the same position, in the X direction, as the first end 10a of the pressure chamber 10, and the first end 264a of the second active portion 264 had the same position, in the X direction, as the second end 10b of the pressure chamber 10.

Figure 13:
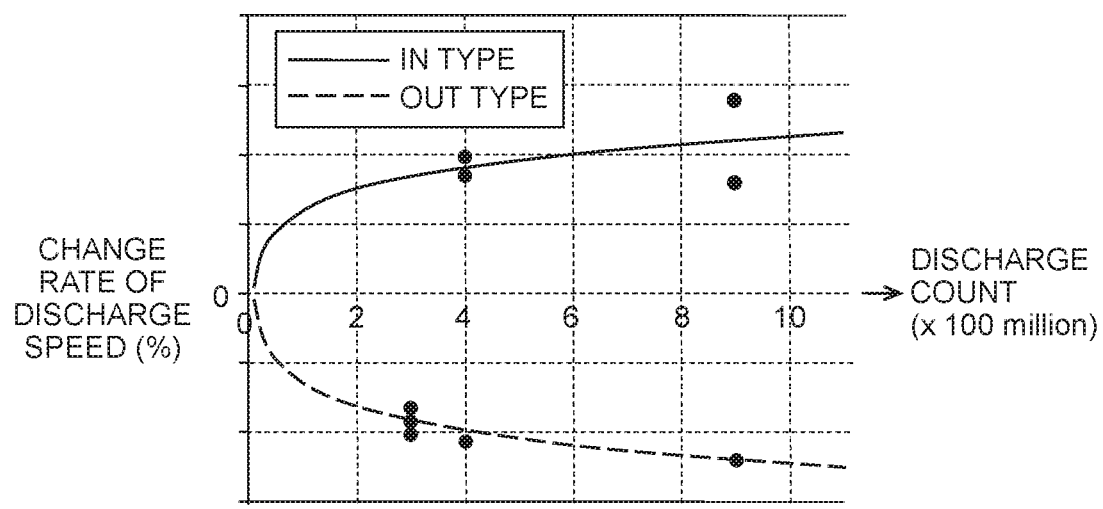
FIG. 13 is a graph indicating an experimental result of a drive deterioration.

In each head, the actuator unit was driven to discharge liquid from a discharge opening and its discharge speed was measured per a certain discharge count. In FIG. 13, a horizontal axis indicates a discharge count, and a vertical axis indicates a change rate of discharge speed, wherein a case, in which the discharge count is zero, is used as a reference. A solid line and broken line in FIG. 13 are approximate curves that respectively indicate the measurement results obtained by the IN-type and OUT-type heads.

As understood from FIG. 13, in the OUT-type actuator unit, the discharge speed decreases (i.e., the deformation amount decreases) as the discharge count increases (i.e., the deformation count of the actuator unit increases). In the IN-type actuator unit, the discharge speed increases (i.e., the deformation amount increases) as the discharge count increases. The second active portions of the IN-type actuator unit have a portion that overlaps in the Z direction with the first active portion and a portion that is adjacent to or close to the first active portion in the X direction. Thus, it is presumed that a portion where polarization is uncertain is generated at a boundary between the second active portion and the first active portion, which contributes to inhibit the drive deterioration of the actuator unit.

<Positional Shift Analysis 1>

The inventor of the present application analyzed the head with the IN-type actuator unit (FIGS. 9A and 9B) under the following conditions.

Thickness of the piezoelectric layer 41 (length in the Z direction): 15 μm

Thickness of the piezoelectric layer 42 (length in the Z direction): 15 μm

Thickness of the piezoelectric layer 43 (length in the Z direction): 13.3 μm

Thickness of the ink separation layer 44 (length in the Z direction): 10 μm

Figure 14A:
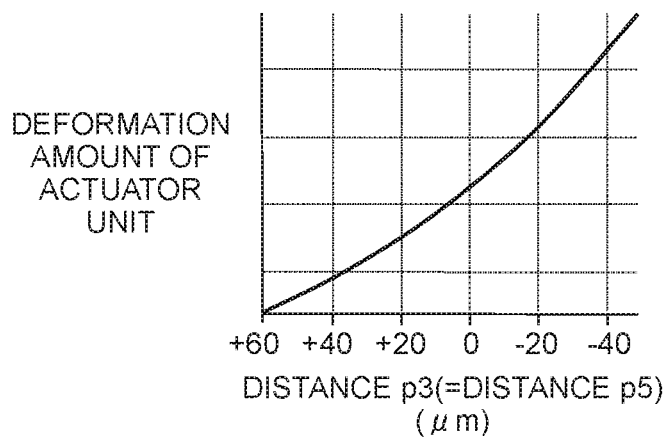
FIGS. 14A and 14B are graphs indicating results of Analysis 1, which relates to a positional shift.
Figure 14B:
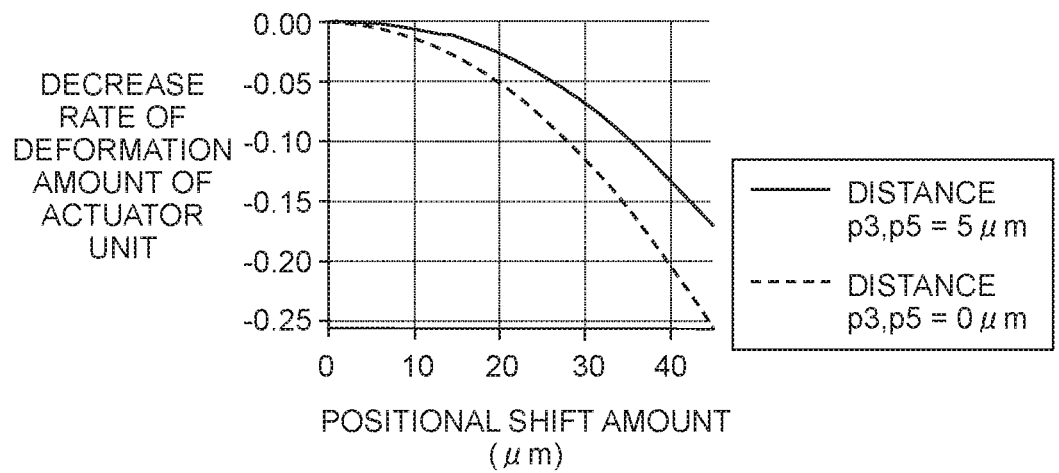

Length in the X direction of the high potential electrode 52 (length in the X direction of the first active portion 61): 220 μm Length D in the X direction of the pressure chamber 10: 350 μm In FIGS. 14A and 14B, a horizontal axis indicates a distance p3 in the X direction from the first end 10a of the pressure chamber 10 to the first end 263a of the second active portion 263 and a distance p5 in the X direction from the second end 265b of the second active portion 265 to the second end 10b of the pressure chamber 10 (see FIG. 8). When each of the distances p3 and p5 is plus, the second active portions 263 and 265 overlap in the Z direction with the pressure chamber 10. When each of the distances p3 and p5 is zero, the first end 263a of the second active portion 263 and the first end 10a of the pressure chamber 10 are in the same position in the X direction, and the second end 265b of the second active portion 265 and the second end 10b of the pressure chamber 10 are in the same position in the X direction. When each of the distances p3 and p5 is minus, each of the second active portions 263 and 265 has a portion that does not overlap in the Z direction with the pressure chamber 10.

As understood from FIG. 14A, an incline of the deformation amount of the actuator unit in a range where each of the distances p3 and p5 is plus is smaller than that in a range where each of the distances p3 and p5 is minus. Further, when each of the distances p3 and p5 is plus, and when the positional shift in the X direction is caused between the channel unit 21 and the piezoelectric actuator 22 as depicted in FIG. 11, the distance p3 increases. This gradually decreases the deformation amount of the actuator unit due to the contraction of the second active portion 263. Meanwhile, since the distance p5 decreases, the deformation amount of the actuator unit due to the contraction of the second active portion 265 greatly increases. Accordingly, it is possible to inhibit the decrease in the deformation amount of the entire actuator unit.

In FIG. 14B, the solid line indicates an analysis result when each of the distances p3 and p5 is 5 μm, and the broken line indicates an analysis result when each of the distances p3 and p5 is 0 μm. The positional shift amount means a distance in the X direction from the center portion 61c of the first active portion 61 to a center portion 10e of the pressure chamber 10. As understood from FIG. 14B, the positional shift in the X direction between the channel unit 21 and the piezoelectric actuator 22 as depicted in FIG. 11 may be caused. In that case, as the positional shift amount increases, the deformation amount of the actuator unit decreases both when each of the distances p3 and p5 is 5 μm and when each of the distances p3 and p5 is 0 μm. The decrease in the deformation amount of the actuator unit when each of the distances p3 and p5 is 5 μm is smaller than that when each of the distances p3 and p5 is 0 μm.

<Positional Shift Analysis 2>

The inventor of the present application analyzed the head with the OUT-type actuator unit (FIGS. 10A and 10B) under the following conditions.

Thickness of the piezoelectric layer 41 (length in the Z direction): 15 μm

Thickness of the piezoelectric layer 42 (length in the Z direction): 15 μm

Thickness of the piezoelectric layer 43 (length in the Z direction): 13.3 μm

Thickness of the ink separation layer 44 (length in the Z direction): 10 μm

Length in the X direction of the driving electrode 51: 438 μm

Figure 15A:
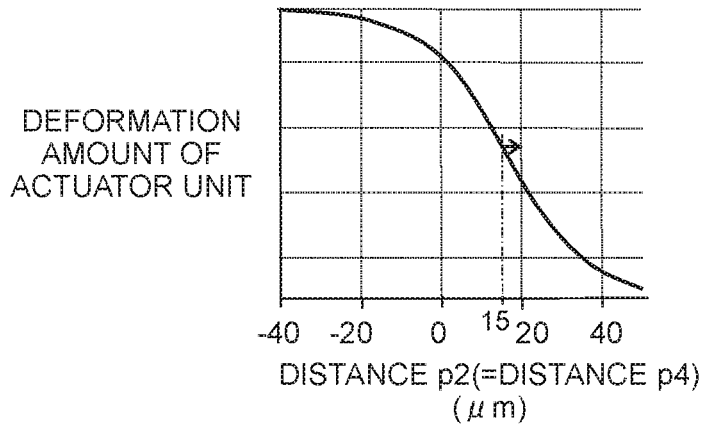
FIGS. 15A to 15C are graphs indicating results of Analysis 2, which relates to a positional shift.
Figure 15B:
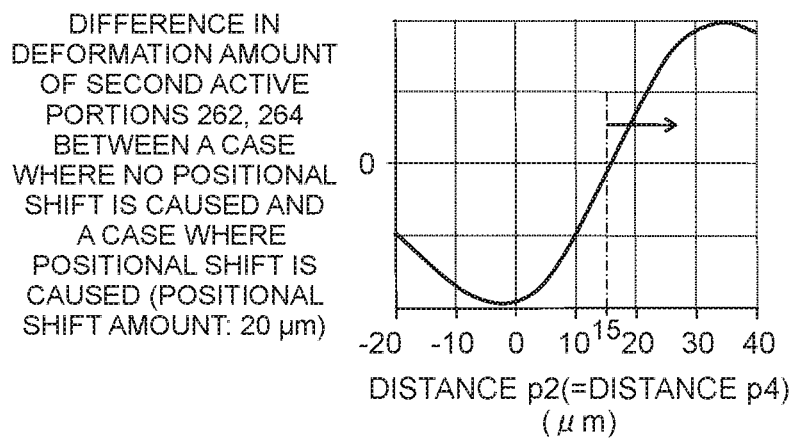

Length in the X direction of the high potential electrode 52 (length in the X direction of the first active portion 61): 220 μm Length D in the X direction of the pressure chamber 10: 340 μm In FIGS. 15A and 15B, a horizontal axis indicates a distance p2 in the X direction from the second end 262b of the second active portion 262 to the first end 10a of the pressure chamber 10 and a distance p4 in the X direction from the second end 10b of the pressure chamber 10 to the first end 264a of the second active portion 264 (see FIG. 8). When each of the distances p2 and p4 is plus, the second active portions 262 and 264 do not overlap in the Z direction with the pressure chamber 10. When each of the distances p2 and p4 is zero, the second end 262b of the second active portion 262 and the first end 10a of the pressure chamber 10 are in the same position in the X direction and the first end 264a of the second active portion 264 and the second end 10b of the pressure chamber 10 are in the same position in the X direction. When each of the distances p2 and p4 is minus, each of the second active portions 262 and 264 has a portion that overlaps in the Z direction with the pressure chamber 10.

As understood from FIG. 15A, when each of the distances p2 and p4 is 15 μm, the incline of the deformation amount of the actuator unit changes from the minus to the plus. When each of the distances p2 and p4 is equal to or longer than 15 μm, and when the positional shift in the X direction between the channel unit 21 and the piezoelectric actuator 22 as depicted in FIG. 12 is caused, the distance p4 increases. This gradually decreases the deformation amount of the actuator unit due to the contraction of the second active portion 264. Meanwhile, since the distance p2 decreases, the deformation amount of the actuator unit due to the contraction of the second active portion 262 greatly increases. Accordingly, it is possible to inhibit the decrease in the deformation amount of the entire actuator unit.

As understood from FIG. 15B, when each of the distances p2 and p4 is equal to or longer than approximately 15 μm, and when the positional shift in the X direction (positional shift amount: 20 μm) between the channel unit 21 and the piezoelectric actuator 22 as depicted in FIG. 12 is caused, the deformation amount of the actuator unit due to the contraction of the second active portion 262 is greater than that when no positional shift is caused.

Figure 15C:
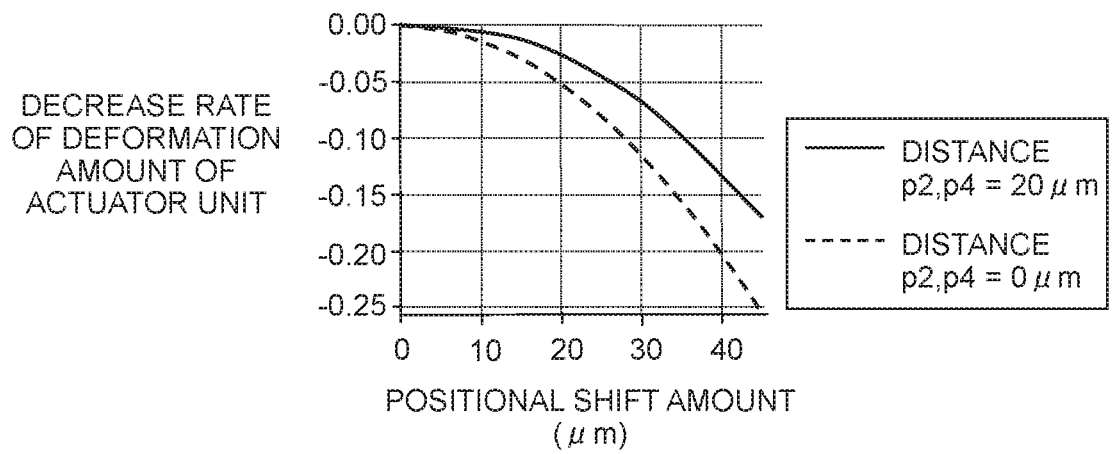

In FIG. 15C, the solid line indicates an analysis result when each of the distances p2 and p4 is 20 μm, and the broken line indicates an analysis result when each of the distances p2 and p4 is 0 μm. As understood from FIG. 15C, the positional shift in the X direction between the channel unit 21 and the piezoelectric actuator 22 as depicted in FIG. 12 may be caused. In that case, as the positional shift amount increases, the deformation amount of the actuator unit decreases both when each of the distances p2 and p4 is 20 μm and when each of the distances p2 and p4 is 0 μm. The decrease in the deformation amount of the actuator unit when each of the distances p2 and p4 is 20 μm is smaller than that when each of the distances p2 and p4 is 0 μm.

MODIFIED EXAMPLE

The embodiments of the present teaching are explained above. The present teaching, however, is not limited to the above embodiments. Various changes or modifications in the design may be made without departing from the claims.

For example, the configurations of the piezoelectric layer and the electrodes in the piezoelectric actuator can be changed as follows. Depending on the change in the electrode arrangement, the thickness (length in the Z direction) of the first active portion 61 and the second active portions 62 and 63 and the positional relation in the Z direction between the first active portion 61 and the second active portions 62, 63 may be changed.

Figure 16A:
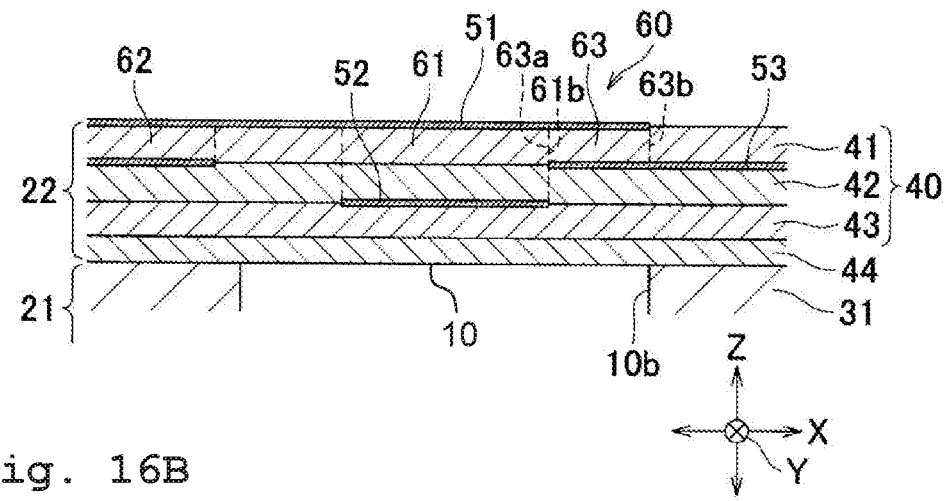
FIGS. 16A to 16C are cross-sectional views corresponding to FIGS. 6A and 6B.

A first modified example depicted in FIG. 16A is a modified example of the first embodiment, wherein the positions of the high potential electrode 52 and the low potential electrode 53 in the Z direction are reversed to those in the first embodiment. In FIG. 16A, the driving electrode 51, the low potential electrode 53, and the high potential electrode 52 are arranged in that order in the Z direction from the top of the piezoelectric body 40. The low potential electrode 53 is disposed between the piezoelectric layers 41 and 42 in the Z direction. The high potential electrode 52 is disposed between the piezoelectric layers 42 and 43 in the Z direction. The low potential electrode 53 is further separated in the Z direction from the pressure chamber 10 than the high potential electrode 52.

In the first modified example, the second active portion 63 does not overlap with the first active portion 61 in the Z direction. The second active portion 63 is adjacent to the first active portion 61 in the X direction. Namely, the first end 63a of the second active portion 63 and the second end 61b of the first active portion 61 are in the same position in the X direction. Further, the second end 63b of the second active portion 63 and the second end 10b of the pressure chamber 10 are in the same position in the X direction.

Figure 16B:
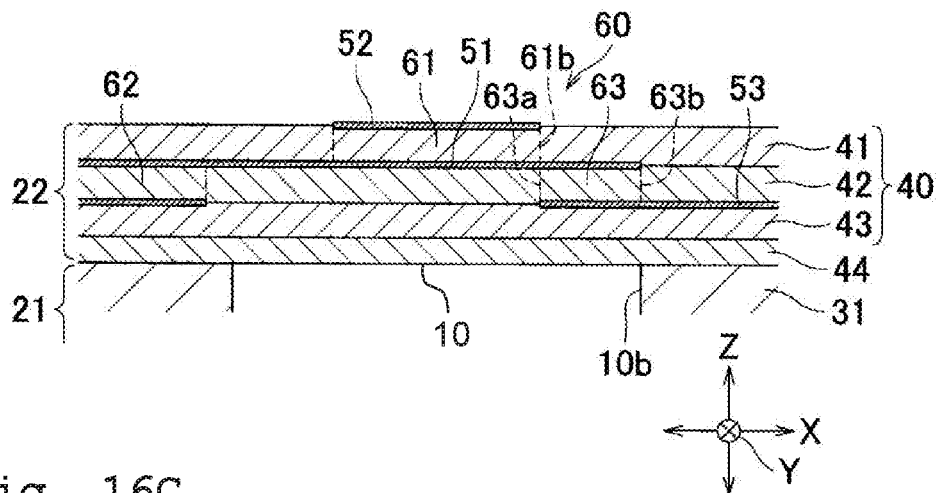

A second modified example depicted in FIG. 16B is a modified example of the first embodiment, wherein the positions of the driving electrode 51 and the high potential electrode 52 in the Z direction are reversed to those in the first embodiment. In FIG. 16B, the high potential electrode 52, the driving electrode 51, and the low potential electrode 53 are arranged in that order in the Z direction from the top of the piezoelectric body 40. The high potential electrode 52 is disposed on the upper surface of the piezoelectric layer 41. The driving electrode 51 is disposed between the piezoelectric layers 41 and 42 in the Z direction.

In the second modified example, similar to the first modified example, the second active portion 63 does not overlap with the first active portion 61 in the Z direction. The second active portion 63 is adjacent to the first active portion 61 in the X direction. Namely, the first end 63a of the second active portion 63 and the second end 61b of the first active portion 61 are in the same position in the X direction. Further, the second end 63b of the second active portion 63 and the second end 10b of the pressure chamber 10 are in the same position in the X direction.

Figure 16C:
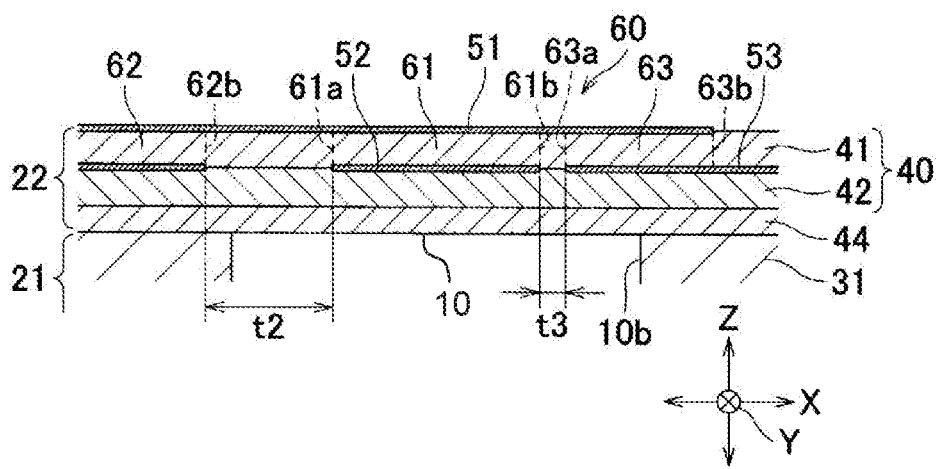

A third modified example depicted in FIG. 16C is a modified example of the first embodiment, wherein two piezoelectric layers are provided. The piezoelectric body 40 includes two piezoelectric layers 41 and 42 stacked in the Z direction. The high potential electrode 52 and the low potential electrode 53 are arranged between the piezoelectric layers 42 and 43 in the Z direction (i.e., in the same layer).

In the third modified example, the second active portion 63 does not overlap with the first active portion 61 in the Z direction. The second active portion 63 is separated from the first active portion 61 in the X direction. Namely, the first end 63a of the second active portion 63 is positioned between the second end 61b of the first active portion 61 and the second end 63b of the second active portion 63. A distance t3 in the X direction from the second end 61b of the first active portion 61 to the first end 63a of the second active portion 63 is shorter than a distance t2 in the X direction from the second end 62b of the second active portion 62 to the first end 61a of the first active portion 61. The second end 63b of the second active portion 63 is positioned between the second end 10b of the pressure chamber 10 and the second end 22b of the piezoelectric actuator 22.

In the first to third modified examples, the second active portion 64 (the fourth portion according to the first aspect of the present teaching) and the second active portion 63 (the third portion according to the first aspect of the present teaching) are positioned symmetrically with respect to a center axis of the first active portion 61. The second active portion 65 (the fifth portion according to the first aspect of the present teaching) and the second active portion 62 (the second portion according to the first aspect of the present teaching) are positioned symmetrically with respect to the center axis of the first active portion 61. Thus, in the first and second modified examples, the second active portion 64 does not overlap with the first active portion 61 in the Z direction, and the second active portion 64 is adjacent to the first active portion 61 in the X direction. Namely, the second end 64b of the second active portion 64 and the first end 61a of the first active portion 61 are in the same position in the X direction. In the third modified example, the second active portion 64 does not overlap with the first active portion 61 in the Z direction, and the second active portion 64 is separated from the first active portion 61 in the X direction. Namely, the second end 64b of the second active portion 64 is positioned between the first end 64a of the second active portion 64 and the first end 61a of the first active portion 61. The distance in the X direction from the second end 64b of the second active portion 64 to the first end 61a of the first active portion 61 is shorter than the distance in the X direction from the second end 61b of the first active portion 61 to the first end 65a of the second active portion 65.

Figure 17A:
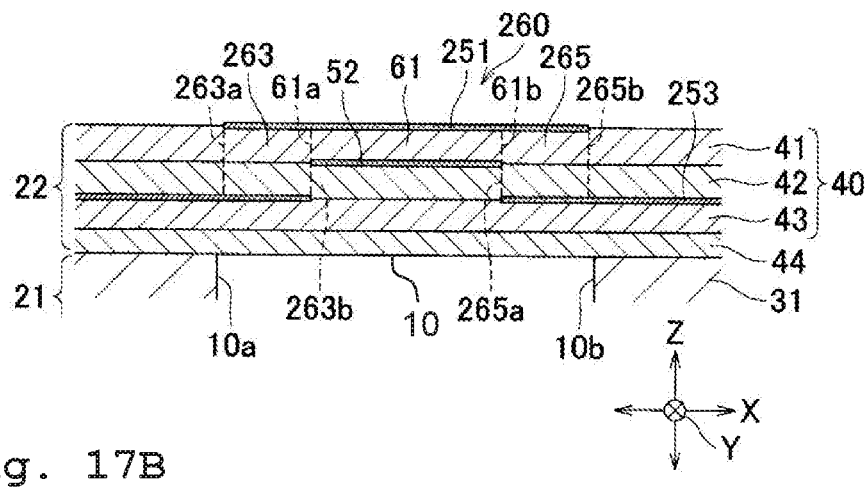
FIG. 17A is a cross-sectional view corresponding to FIGS. 9A and 9B and depicts a head according to a fourth modified example of the present teaching.

A fourth modified example depicted in FIG. 17A is a modified example of the second embodiment, wherein each of the second active portions 263 and 265 do not overlap with the first active portion 61 in the Z direction, and each of the second active portions 263 and 265 is adjacent to the first active portion 61 in the X direction. Namely, the second end 263*b* of the second active portion 263 and the first end 61*a* of the first active portion 61 are in the same position in the X direction. The first end 265*a* of the second active portion 265 and the second end 61*b* of the first active portion 61 are in the same position in the X direction. The first end 263*a* of the second active portion 263 and the first end 10*a* of the pressure chamber 10 are in the same direction in the X direction. The second end 265*b* of the second active portion 265 and the second end 10*b* of the pressure chamber 10 are in the same position in the X direction.

Figure 17B:
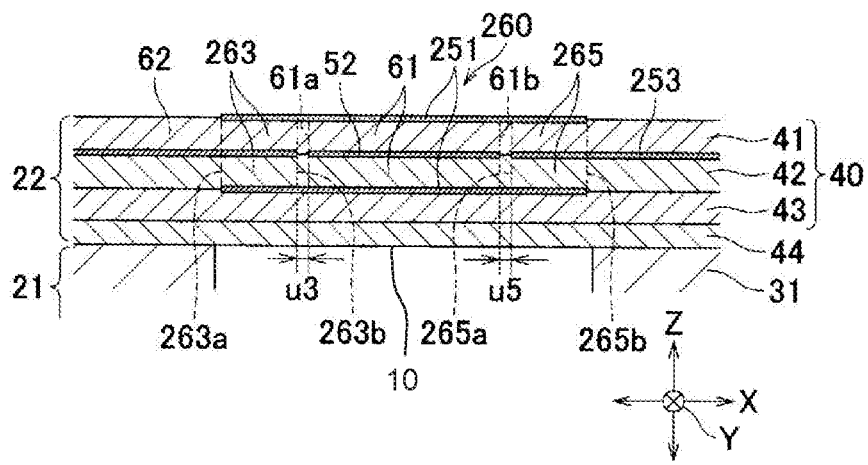
FIG. 17B is a cross-sectional view corresponding to FIGS. 9A and 9B and depicts a head according to a fifth modified example of the present teaching.
Figure 17C:
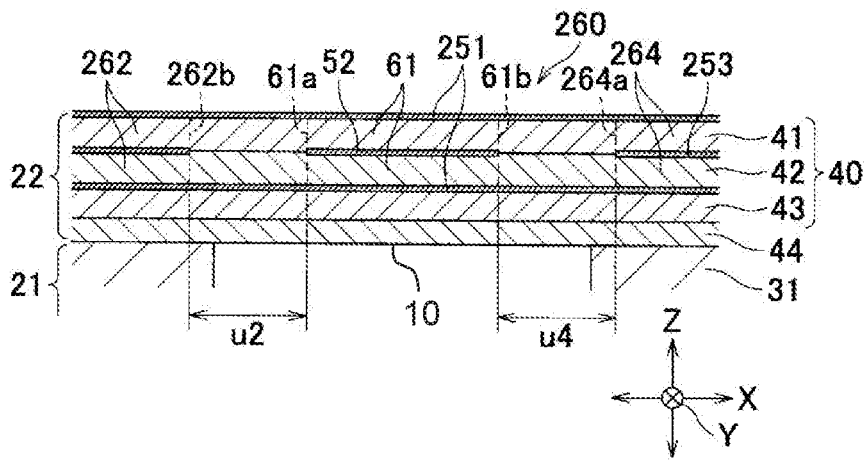
FIG. 17C is a cross-sectional view corresponding to FIGS. 10A and 10B and depicts the head according to the fifth modified example of the present teaching.

Fifth modified examples depicted in FIGS. 17B and 17C are modified examples of the second embodiment, wherein the driving electrodes 251 are formed not only on the upper surface of the piezoelectric layer 41 but also on the upper surface of the piezoelectric layer 43. The high potential electrode 52 and the low potential electrode 253 are arranged between the piezoelectric layers 41 and 42 in the Z direction (i.e., in the same layer). In that configuration, each of the piezoelectric layers 41 and 42 includes the first active portion 61 interposed between the driving electrode 251 and the high potential electrode 52 in the Z direction, and second active portions 262 to 265 interposed between the driving electrode 251 and the low potential electrode 253 in the Z direction.

In the fifth modified example, as depicted in FIG. 17B, each of the second active portions 263 and 265 does not overlap with the first active portion 61 in the Z direction, and each of the second active portions 263 and 265 is separated from the first active portion 61 in the X direction. Namely, the second end 263*b* of the second active portion 263 is positioned between the first end 263*a* of the second active portion 263 and the first end 61*a* of the first active portion 61. The first end 265*a* of the second active portion 265 is positioned between the second end 61*b* of the first active portion 61 and the second end 265*b* of the second active portion 265. A distance u3 in the X direction from the second end 263*b* of the second active portion 263 to the first end 61*a* of the first active portion 61 is shorter than a distance u2 (see FIG. 17C) in the X direction from the second end 262*b* of the second active portion 262 to the first end 61*a* of the first active portion 61. A distance u5 in the X direction from the second end 61*b* of the first active portion 61 to the first end 265*a* of the second active portion 265 is shorter than a distance u4 in the X direction from the second end 61*b* of the first active portion 61 to the first end 264*a* of the second active portion 264. The distance u3 is the same as the distance u5, and the distance u2 is the same as the distance u4.

A sixth modified example depicted in FIG. 18 is a modified example of the second embodiment, wherein the actuator units 260 include pairs of the second active portions 262 to 265 arranged in the Y direction. In FIG. 18, the active portions 61 and 262 to 265 are depicted by solid lines, and illustration of the electrodes 52 and 253 are omitted. In the sixth modified example, the connecting portions 268 and 269 are not provided.

The connecting portion(s) may be omitted (see, the sixth modified example).

The separation layer 44 may be omitted.

Although the first aspect of the present teaching is explained referring to the first embodiment and the second aspect of the present teaching is explained referring to the second embodiment, the present teaching is not limited to the above. For example, it can be said that the second active portions 262 and 265 of the second embodiment respectively correspond to the second portion and the third portion of the first aspect of the present teaching. Further, it can be said that the second active portions 62 and 64 of the first embodiment respectively correspond to the second portion and the third portion of the second aspect of the present teaching.

The first portion may have a portion not overlapping in the third direction with the pressure chamber.

The distance in the first direction from the second end of the second portion to the center portion of the first portion and the distance in the first direction from the center portion of the first portion to the first end of the fifth portion may be equal to or shorter than a half of the distance in the first direction from the first end to the second end of the pressure chamber. The distance in the first direction from the center portion of the first portion to the second end of the third portion and the distance in the first direction from the first end of the fourth portion to the center portion of the first portion may be equal to or longer than the distance in the first direction from the first end to the second end of the pressure chamber.

The seventh portion may not overlap in the second direction with the fifth portion. Specifically, the length in the X direction of the second active portion 65 provided for the pressure chamber 10 on the left side in FIG. 5 and the length in the X direction of the second active portion 62 provided for the pressure chamber 10 on the right side in FIG. 5 may be short and the area between the two pressure chambers 10 occupied by the active portions 62 and 65 may be small.

The length in the first direction of the pressure chamber may be longer than the length in the second direction of the pressure chamber.

The liquid discharge head is not limited to the configuration in which an ink of one color is discharged. The liquid discharge head may discharge inks of multiple colors.

The liquid discharged from the liquid discharge head is not limited to the ink(s). Any other liquid (e.g., a treatment liquid by which components of ink are aggregated or precipitated) may be used.

The liquid discharge head is not limited to the serial-type liquid discharge head. A line-type liquid discharge head may be used.

The present teaching can be applied to a facsimile machine, a copy machine, a multifunction peripheral, and the like without being limited to the printer. The present teaching can be applied to a liquid discharge apparatus used for any other use than image recording (e.g., a liquid discharge apparatus that forms a conductive pattern by discharging a conductive liquid on a substrate).

What is claimed is:
1. A liquid discharge head comprising:
a channel unit having a discharge surface that defines a discharge opening and that is parallel to a first direction and a second direction orthogonal to the first direction, and a pressure chamber communicating with the discharge opening; and
a piezoelectric actuator stacked on the channel unit in a third direction perpendicular to the discharge surface, wherein the piezoelectric actuator includes:
a piezoelectric body having piezoelectric layers stacked in the third direction;
a first electrode;
a second electrode separated from the first electrode in the third direction; and
a third electrode separated from the first electrode in the third direction, the piezoelectric body has:
a first portion that is interposed in the third direction between the first electrode and the second electrode and that at least partially overlaps in the third direction with the pressure chamber;
a second portion that is interposed in the third direction between the first electrode and the third electrode; and
a third portion that is interposed in the third direction between the first electrode and the third electrode and that is separated from the second portion in the first direction,
the first portion has a portion that is positioned in the first direction between the second portion and the third portion,
the piezoelectric actuator has a first end and a second end in the first direction,
the first portion has a first end and a second end in the first direction,
the second end of the first portion is positioned in the first direction between the first end of the first portion and the second end of the piezoelectric actuator,
the second portion has a first end and a second end in the first direction,
the second end of the second portion is positioned in the first direction between the first end of the second portion and the second end of the piezoelectric actuator,
the third portion has a first end and a second end in the first direction,
the second end of the third portion is positioned in the first direction between the first end of the third portion and the second end of the piezoelectric actuator,
the second end of the second portion is positioned in the first direction between the first end of the second portion and the first end of the first portion, and
the first end of the third portion is positioned at any of the following positions (a) to (c):
  (a) a position in the first direction between the first end and the second end of the first portion,
  (b) a position that is the same, in the first direction, as the second end of the first portion, and
  (c) a position in the first direction between the second end of the first portion and the second end of the third portion, wherein a distance in the first direction from the second end of the first portion to the first end of the third portion is shorter than a distance in the first direction from the second end of the second portion to the first end of the first portion.

2. The liquid discharge head according to claim 1, wherein a position in the second direction of the third portion is the same as that of the second portion,
the piezoelectric body further has:
  a fourth portion that is interposed in the third direction between the first electrode and the third electrode and that is positioned in the first direction between the second portion and the third portion, wherein a position in the second direction of the fourth portion is different from those of the second portion and the third portion, and
  a fifth portion that is interposed in the third direction between the first electrode and the third electrode and that is separated from the fourth portion in the first direction, wherein a position in the second direction of the fifth portion is the same as that of the fourth portion,
the first portion has a portion that is positioned in the first direction between the fourth portion and the fifth portion,
the fourth portion has a first end and a second end in the first direction,
the second end of the fourth portion is positioned in the first direction between the first end of the fourth portion and the second end of the piezoelectric actuator,
the fifth portion has a first end and a second end in the first direction,
the second end of the fifth portion is positioned in the first direction between the first end of the fifth portion and the second end of the piezoelectric actuator,
the first end of the fifth portion is positioned in the first direction between the second end of the first portion and the second end of the fifth portion, and
the second end of the fourth portion is positioned at any of the following positions (a) to (c):
  (a) the position in the first direction between the first end and the second end of the first portion,
  (b) a position that is the same, in the first direction, as the first end of the first portion, and
  (c) a position in the first direction between the first end of the fourth portion and the first end of the first portion, wherein a distance in the first direction from the second end of the fourth portion to the first end of the first portion is shorter than a distance in the first direction from the second end of the first portion to the first end of the fifth portion.

3. The liquid discharge head according to claim 2, wherein the pressure chamber has a first end and a second end in the first direction,
  the second end of the pressure chamber is positioned in the first direction between the first end of the pressure chamber and the second end of the piezoelectric actuator, and
  a distance in the first direction from the second end of the second portion to a center portion of the first portion and a distance in the first direction from the center portion of the first portion to the first end of the fifth portion are longer than a half of a distance in the first direction from the first end to the second end of the pressure chamber.

4. The liquid discharge head according to claim 2, wherein the pressure chamber has a first end and a second end in the first direction,
  the second end of the pressure chamber is positioned in the first direction between the first end of the pressure chamber and the second end of the piezoelectric actuator, and
  a distance in the first direction from a center portion of the first portion to the second end of the third portion and a distance in the first direction from the first end of the fourth portion to the center portion of the first portion are equal to or shorter than a half of a distance in the first direction from the first end to the second end of the pressure chamber.

5. The liquid discharge head according to claim 2, wherein a length in the second direction of the pressure chamber is longer than a length in the first direction of the pressure chamber.

6. The liquid discharge head according to claim 2, wherein the channel unit further includes another pressure chamber in a position in the first direction between the pressure chamber and the second end of the piezoelectric actuator,
the piezoelectric actuator further includes:
  a fourth electrode positioned in the first direction between the first electrode and the second end of the piezoelectric actuator, a fifth electrode that is separated from the fourth electrode in the third direction, and
a sixth electrode that is separated from the fourth electrode in the third direction,
the piezoelectric body further has:
a sixth portion that is interposed in the third direction between the fourth electrode and the fifth electrode and that at least partially overlaps in the third direction with the another pressure chamber,
a seventh portion that is interposed in the third direction between the fourth electrode and the sixth electrode,
an eighth portion that is interposed in the third direction between the fourth electrode and the sixth electrode and that is separated from the seventh portion in the first direction, wherein a position in the second direction of the eighth portion is the same as that of the seventh portion,
a ninth portion that is interposed in the third direction between the fourth electrode and the sixth electrode and that is positioned in the first direction between the seventh portion and the eighth portion, wherein a position in the second direction of the ninth portion is different from those of the seventh portion and the eighth portion, and
a tenth portion that is interposed in the third direction between the fourth electrode and the sixth electrode and that is separated from the ninth portion in the first direction, wherein a position in the second direction of the tenth portion is the same as that of the ninth portion,
the sixth portion has a portion that is positioned in the first direction between the seventh portion and the eighth portion and that is positioned in the first direction between the ninth portion and the tenth portion,
the sixth portion has a first end and a second end in the first direction,
the second end of the sixth portion is positioned in the first direction between the first end of the sixth portion and the second end of the piezoelectric actuator,
the seventh portion has a first end and a second end in the first direction,
the second end of the seventh portion is positioned in the first direction between the first end of the seventh portion and the second end of the piezoelectric actuator,
the eighth portion has a first end and a second end in the first direction,
the second end of the eighth portion is positioned in the first direction between the first end of the eighth portion and the second end of the piezoelectric actuator,
the ninth portion has a first end and a second end in the first direction,
the second end of the ninth portion is positioned in the first direction between the first end of the ninth portion and the second end of the piezoelectric actuator,
the tenth portion has a first end and a second end in the first direction,
the second end of the tenth portion is positioned in the first direction between the first end of the tenth portion and the second end of the piezoelectric actuator,
the second end of the seventh portion is positioned in the first direction between the first end of the seventh portion and the first end of the sixth portion,
the first end of the eighth portion is positioned at any of the following positions (a) to (c):
(a) a position in the first direction between the first end and the second end of the sixth portion,
(b) a position that is the same, in the first direction, as the second end of the sixth portion, and
(c) a position in the first direction between the second end of the sixth portion and the second end of the eighth portion, wherein a distance in the first direction from the second end of the sixth portion to the first end of the eighth portion is shorter than a distance in the first direction from the second end of the seventh portion to the first end of the sixth portion,
the first end of the tenth portion is positioned in the first direction between the second end of the sixth portion and the second end of the tenth portion,
the second end of the ninth portion is positioned at any of the following positions (a) to (c):
(a) the position in the first direction between the first end and the second end of the sixth portion,
(b) a position that is the same, in the first direction, as the first end of the sixth portion, and
(c) a position in the first direction between the first end of the ninth portion and the first end of the sixth portion, wherein a distance in the first direction from the second end of the ninth portion to the first end of the sixth portion is shorter than a distance in the first direction from the second end of the sixth portion to the first end of the tenth portion, and
the seventh portion at least partially overlaps with the fifth portion in the second direction.

7. The liquid discharge head according to claim 2, wherein the first electrode has a protrusion that protrudes in the second direction from a portion overlapping in the third direction with the fifth portion so that the protrusion extends from a side of the third portion to a side of the fifth portion,
the protrusion includes a contact configured to electrically connect to a trace of a wiring board, and
the whole of the protrusion does not overlap with the pressure chamber in the third direction.

8. The liquid discharge head according to claim 2, wherein the second portion is separated from the fourth portion in the first direction and the second portion is adjacent to the fourth portion in the second direction,
the third portion is separated from the fifth portion in the first direction and the third portion is adjacent to the fifth portion in the second direction,
the piezoelectric body further includes:
a first connecting portion that is interposed in the third direction between the first electrode and the third electrode and that connects the second portion and the fourth portion in the first direction, and
a second connecting portion that is interposed in the third direction between the first electrode and the third electrode and that connects the third portion and the fifth portion in the first direction.

9. The liquid discharge head according to claim 1, wherein the first end of the third portion is positioned in the first direction between the first end and the second end of the first portion.

10. A liquid discharge head comprising:
a channel unit having a discharge surface that defines a discharge opening and that is parallel to a first direction and a second direction orthogonal to the first direction, and a pressure chamber communicating with the discharge opening; and
a piezoelectric actuator stacked on the channel unit in a third direction perpendicular to the discharge surface, wherein the piezoelectric actuator includes:
a piezoelectric body having piezoelectric layers stacked in the third direction;
a first electrode;
a second electrode separated from the first electrode in the third direction; and
a third electrode separated from the first electrode in the third direction,
the piezoelectric body has:
a first portion that is interposed in the third direction between the first electrode and the second electrode and that at least partially overlaps in the third direction with the pressure chamber;
a second portion that is interposed in the third direction between the first electrode and the third electrode; and
a third portion that is interposed in the third direction between the first electrode and the third electrode, wherein a position in the second direction of the third portion is different from that of the second portion,
the third portion has a portion that is positioned in the first direction between the second portion and the first portion,
the piezoelectric actuator has a first end and a second end in the first direction,
the first portion has a first end and a second end in the first direction,
the second end of the first portion is positioned in the first direction between the first end of the first portion and the second end of the piezoelectric actuator,
the second portion has a first end and a second end in the first direction,
the second end of the second portion is positioned in the first direction between the first end of the second portion and the second end of the piezoelectric actuator,
the third portion has a first end and a second end in the first direction,
the second end of the third portion is positioned in the first direction between the first end of the third portion and the second end of the piezoelectric actuator,
the second end of the second portion is positioned in the first direction between the first end of the second portion and the first end of the first portion, and
the second end of the third portion is positioned at any of the following positions (a) to (c):
(a) a position in the first direction between the first end and the second end of the first portion,
(b) a position that is the same, in the first direction, as the first end of the first portion, and
(c) a position in the first direction between the first end of the third portion and the first end of the first portion, wherein a distance in the first direction from the second end of the third portion to the first end of the first portion is shorter than a distance in the first direction from the second end of the second portion to the first end of the first portion.

11. The liquid discharge head according to claim 10, wherein the piezoelectric body further has:
a fourth portion that is interposed in the third direction between the first electrode and the third electrode and that is positioned in the first direction between the second portion and the second end of the piezoelectric actuator, wherein a position in the second direction of the fourth portion is the same as that of the second portion, and
a fifth portion that is interposed in the third direction between the first electrode and the third electrode and that is positioned in the first direction between the third portion and the second end of the piezoelectric actuator, wherein a position in the second direction of the fifth portion is the same as that of the third portion,
the fifth portion has a portion that is positioned in the first direction between the first portion and the fourth portion,
the fourth portion has a first end and a second end in the first direction,
the second end of the fourth portion is positioned in the first direction between the first end of the fourth portion and the second end of the piezoelectric actuator,
the fifth portion has a first end and a second end in the first direction,
the second end of the fifth portion is positioned in the first direction between the first end of the fifth portion and the second end of the piezoelectric actuator,
the first end of the fourth portion is positioned in the first direction between the second end of the first portion and the second end of the fourth portion, and
the first end of the fifth portion is positioned at any of the following positions (a) to (c):
(a) the position in the first direction between the first end and the second end of the first portion,
(b) a position that is the same, in the first direction, as the second end of the first portion, and
(c) a position in the first direction between the second end of the first portion and the second end of the fifth portion, wherein a distance in the first direction from the second end of the first portion to the first end of the fifth portion is shorter than a distance in the first direction from the second end of the first portion to the first end of the fourth portion.

12. The liquid discharge head according to claim 11, wherein the pressure chamber has a first end and a second end in the first direction,
the second end of the pressure chamber is positioned in the first direction between the first end of the pressure chamber and the second end of the piezoelectric actuator, and
a distance in the first direction from the second end of the second portion to the first end of the fourth portion is longer than a distance in the first direction from the first end to the second end of the pressure chamber.

13. The liquid discharge head according to claim 11, wherein the pressure chamber has a first end and a second end in the first direction,
the second end of the pressure chamber is positioned in the first direction between the first end of the pressure chamber and the second end of the piezoelectric actuator, and
a distance in the first direction from the first end of the third portion to the second end of the fifth portion is equal to or shorter than a distance in the first direction from the first end to the second end of the pressure chamber.

14. The liquid discharge head according to claim 11, wherein a length in the second direction of the pressure chamber is longer than a length in the first direction of the pressure chamber.

15. The liquid discharge head according to claim 11, wherein the third portion and the fifth portion are closer, in the second direction, to the discharge opening than the second portion and the fourth portion.

16. The liquid discharge head according to claim 11, wherein the first electrode has a protrusion that protrudes in the second direction from a portion overlapping in the third direction with the fourth portion so that the protrusion extends from a side of the fifth portion to a side of the fourth portion, the protrusion includes a contact configured to electrically connect to a trace of a wiring board, and the whole of the protrusion does not overlap with the pressure chamber in the third direction.

17. The liquid discharge head according to claim 11, wherein the second portion is separated from the third portion in the first direction and the second portion is adjacent to the third portion in the second direction, the fourth portion is separated from the fifth portion in the first direction and the fourth portion is adjacent to the fifth portion in the second direction, the piezoelectric body further includes:

a first connecting portion that is interposed between the first electrode and the third electrode in the third direction and that connects the second portion and the third portion in the first direction, and a second connecting portion that is interposed between the first electrode and the third electrode in the third direction and that connects the fourth portion and the fifth portion in the first direction.

18. The liquid discharge head according to claim 10, wherein the second end of the third portion is positioned in the first direction between the first end and the second end of the first portion.

\* \* \* \* \*